(12) United States Patent
Gross et al.

(10) Patent No.: US 11,057,053 B2
(45) Date of Patent: Jul. 6, 2021

(54) METHOD AND APPARATUS FOR WIRELESSLY COMMUNICATING OVER A NOISY CHANNEL WITH A VARIABLE CODEWORD LENGTH POLAR CODE TO IMPROVE TRANSMISSION CAPACITY

(71) Applicants: Huawei Technologies Co., Ltd., Shenzhen (CN); THE ROYAL INSTITUTION FOR THE ADVANCEMENT OF LEARNING/MCGILL UNIVERSITY, Montreal (CA)

(72) Inventors: Warren Jeffrey Gross, Cote-St-Luc (CA); Adam Christian Cavatassi, Mississauga (CA); Thibaud Tonnellier, Montreal (CA); Yiqun Ge, Kanata (CA)

(73) Assignees: Huawei Technologies Co., Ltd., Shenzhen (CN); The Royal Institution for the Advancement of Learning/McGill University, Montreal (CA)

( * ) Notice: Subject to any disclaimer, the term of this patent is extended or adjusted under 35 U.S.C. 154(b) by 0 days.

(21) Appl. No.: 16/569,813

(22) Filed: Sep. 13, 2019

(65) Prior Publication Data
US 2020/0106459 A1 Apr. 2, 2020

Related U.S. Application Data

(60) Provisional application No. 62/738,515, filed on Sep. 28, 2018.

(51) Int. Cl.
*H03M 13/13* (2006.01)
*H03M 13/00* (2006.01)
(Continued)

(52) U.S. Cl.
CPC ....... *H03M 13/13* (2013.01); *H03M 13/1131* (2013.01); *H03M 13/39* (2013.01); *H03M 13/616* (2013.01); *H03M 13/6362* (2013.01)

(58) Field of Classification Search
CPC .. H03M 13/13; H03M 13/1131; H03M 13/39; H03M 13/616; H03M 13/6362
See application file for complete search history.

(56) References Cited

U.S. PATENT DOCUMENTS

2002/0157058 A1* 10/2002 Ariel ............... H03M 13/35
714/774
2007/0204205 A1* 8/2007 Niu ............... H03M 13/356
714/780
(Continued)

FOREIGN PATENT DOCUMENTS

CN 106998208 A 8/2017
WO 2017176309 A1 10/2017

OTHER PUBLICATIONS

A. Cavatassi, T. Tonnellier, and W J. Gross, "Asymmetric construction of low-latency and length-flexible polar codes," arXiv preprint arXiv:1902.02402, 2019.
(Continued)

*Primary Examiner* — Guy J Lamarre
(74) *Attorney, Agent, or Firm* — Slater Matsil, LLP

(57) ABSTRACT

Systems and methods of communicating using asymmetric polar codes are provided which overcome the codeword length constraints of systems and methods of communicating that use traditional polar codes. Used herein, asymmetric polar codes refers to a polarizing linear block code of any arbitrary length that is constructed by connecting together constituent polar codes of unequal length. Asymmetric polar codes may be known by other names. In comparison to conventional solutions for variable codeword length, asymmetric polar codes may provide more flexibility, improved
(Continued)

performance, and/or reduced complexity of decoding, encoding, or code design. The system and method provide a flexible, universal, and well-defined coding scheme and to provide sound bit-error correction performance and low decoding latency (compared with current length-compatible methods which can be used with current hardware designs). For the most part, the provided embodiments can be implemented with nearly all available current encoding/decoding polar code techniques.

20 Claims, 22 Drawing Sheets

(51) Int. Cl.
*H03M 13/11* (2006.01)
*H03M 13/39* (2006.01)

(56) References Cited

U.S. PATENT DOCUMENTS

| | | | | |
|---|---|---|---|---|
| 2008/0016425 | A1* | 1/2008 | Khan | H03M 13/2957 714/755 |
| 2010/0241929 | A1* | 9/2010 | Song | H03M 13/13 714/763 |
| 2013/0103991 | A1* | 4/2013 | Evain | H03M 13/616 714/701 |
| 2018/0226999 | A1* | 8/2018 | Wang | H03M 13/3784 |
| 2019/0165884 | A1* | 5/2019 | Koike-Akino | H03M 13/251 |
| 2019/0245650 | A1* | 8/2019 | Hui | H04L 1/0066 |

OTHER PUBLICATIONS

H. Afser and H. Deliç, "Polar codes with higher-order memory," Problems of Information Transmission, vol. 54, pp. 301-328, Oct. 2018.

A. Elkelesh, M. Ebada, S. Cammerer, and S. t. Brink, "Flexible length polar codes through graph based augmentation," in SCC 2017; 11th International ITG Conference on Systems, Communications and Coding, pp. 1-6, Feb. 2017.

Arikan, E. , "Channel Polarization: A Method for Constructing Capacity-Achieving Codes for Symmetric Binary-Input Memoryless Channels", IEEE Transactions on Information Theory, vol. 55, No. 7, pp. 3051-3073, Jul. 2009 (Jul. 2009),total 23 pages.

Zhao et al., "An Adaptive IR-HARQ Scheme for Polar Codes by Polarizing Matrix Extension", IEEE Communications Letters, vol. 22, No. 7, pp. 1306-1309, Jul. 2018 (Jul. 2018),total 4 pages.

Cavatassi et al. , "Asymmetric Construction of Low-Latency and Length-Flexible Polar Codes", ICC 2019—2019 IEEE International Conference on Communications (ICC), Date of Conference May 20-24, 2019 (May 24, 2019),total 6 pages.

* cited by examiner $$G_2 = \begin{bmatrix} 1 & 0 \\ 1 & 1 \end{bmatrix} \quad G_2^{\otimes 2} = \begin{bmatrix} G_2 & 0 \\ G_2 & G_2 \end{bmatrix} \quad G_2^{\otimes 3} = \begin{bmatrix} G_2 & 0 & 0 & 0 \\ G_2 & G_2 & 0 & 0 \\ G_2 & 0 & G_2 & 0 \\ G_2 & G_2 & G_2 & G_2 \end{bmatrix}$$

$$G_2^{\otimes 2} = \begin{bmatrix} 1 & 0 & 0 & 0 \\ 1 & 1 & 0 & 0 \\ 1 & 0 & 1 & 0 \\ 1 & 1 & 1 & 1 \end{bmatrix} \leftarrow 102$$

$$G_2^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}$$

$\leftarrow 104$

FIG. 1

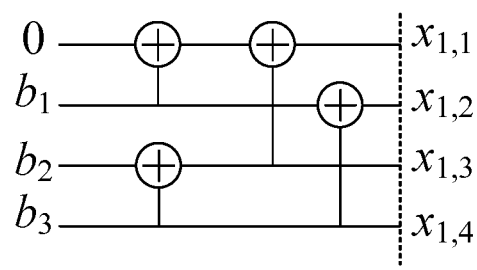
1st Transmission
3 bits on N-4 Polar Code
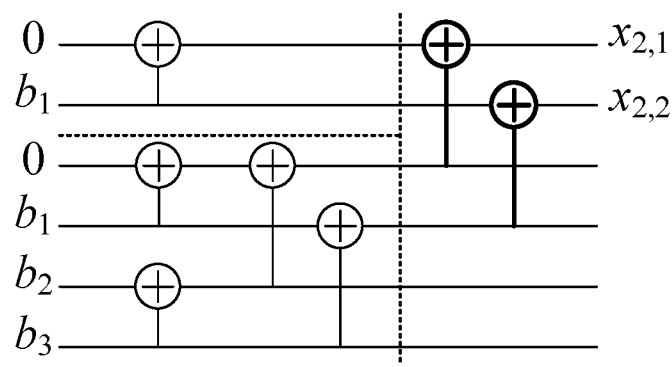
2nd Transmission
2 bits on $N_A$-2 Polar Code
FIG. 17A

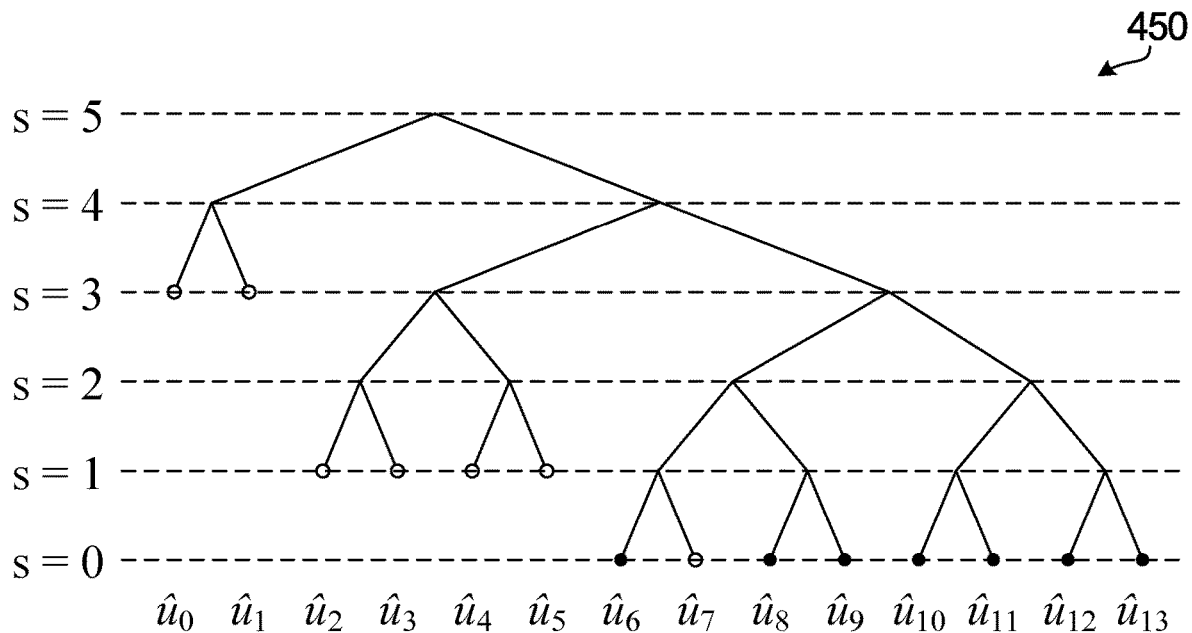
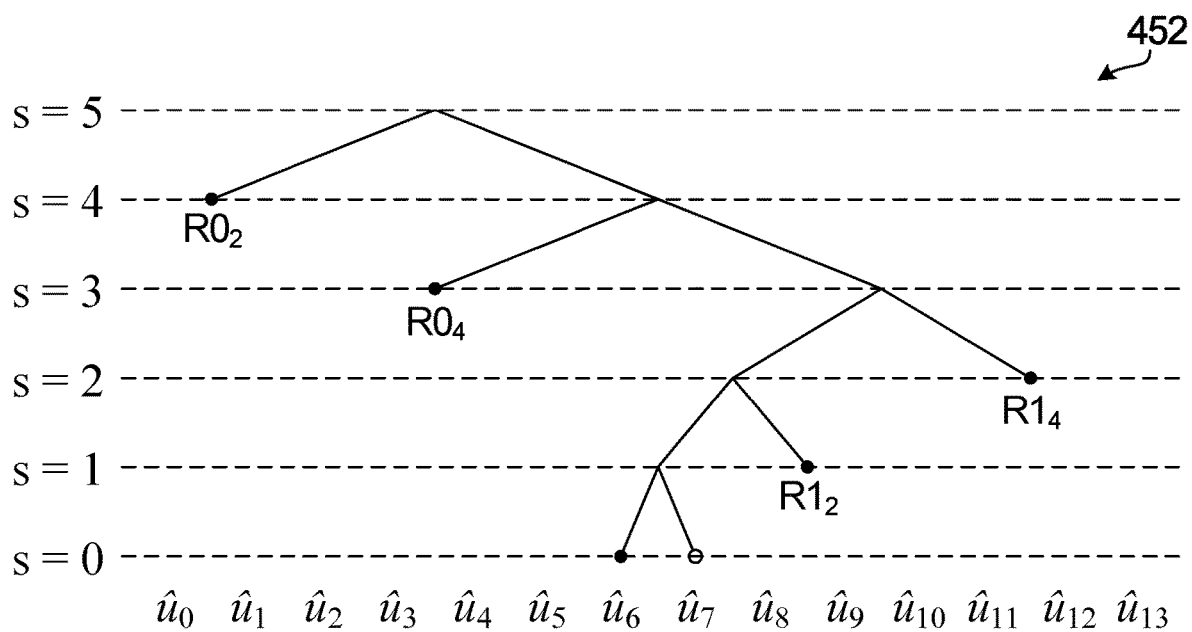
FIG. 18

$$G_{N_A} = \begin{bmatrix} G_2^{\otimes \log_2 N_{p-1}} & G_2^{\otimes \log_2 N_{p-1}} \otimes \hat{0}_{\sum_{p-1}^{p-2} \frac{N_i}{N_{p-1}}} & \cdots & G_2^{\otimes \log_2 N_{p-1}} \otimes \hat{0}_{\sum_{p-1}^{p-2} \frac{N_i}{N_{p-1}}} \\ G_2^{\otimes \log_2 N_{p-1}} \otimes \hat{1}_{\sum_{p-1}^{p-2} \frac{N_i}{N_{p-1}}} & G_2^{\otimes \log_2 N_{p-2}} & \cdots & G_2^{\otimes \log_2 N_{p-2}} \otimes \hat{0}_{\sum_{p-2}^{p-3} \frac{N_i}{N_{p-2}}} \\ \vdots & \vdots & \ddots & \vdots \\ G_2^{\otimes \log_2 N_{p-1}} \otimes \hat{1}_{\sum_{p-1}^{p-2} \frac{N_i}{N_{p-1}}} & G_2^{\otimes \log_2 N_{p-2}} \otimes \hat{1}_{\sum_{p-2}^{p-3} \frac{N_i}{N_{p-2}}} & \cdots & G_2^{\otimes \log_2 N_1} \otimes \hat{0}_{\sum_{p-2}^{p-2} \frac{N_i}{N_1}} \\ & & & G_2^{\otimes \log_2 N_0} \end{bmatrix}$$

$$= \begin{bmatrix} G_{N_{p-1}} & 0 & \cdots & 0 \\ G_{N_{p-2}} \otimes \hat{1}_{\sum_{p-2}^{p-3} \frac{N_i}{N_{p-2}}} & G_{N_{p-2}} & \cdots & 0 \\ \vdots & \vdots & \ddots & \vdots \\ G_{N_1} \otimes \hat{1}_{\sum_{p-1}^{p-2} \frac{N_i}{N_1}} & & \cdots & G_{N_1} & 0 \\ & & & G_{N_0} \otimes \hat{1}_{\sum_{p-1}^{p-2} \frac{N_i}{N_1}} & G_{N_0} \end{bmatrix} \quad (5)$$

FIG. 25

METHOD AND APPARATUS FOR WIRELESSLY COMMUNICATING OVER A NOISY CHANNEL WITH A VARIABLE CODEWORD LENGTH POLAR CODE TO IMPROVE TRANSMISSION CAPACITY

RELATED APPLICATION

This application claims the benefit of U.S. Provisional Patent Application No. 62/738,515 filed Sep. 28, 2018, hereby incorporated by reference in its entirety.

FIELD

The present disclosure relates to generally to communications and, in particular, to methods and apparatus for wirelessly communicating over a noisy channel using polar codes.

BACKGROUND

Polar codes are proposed as channel codes for use in future wireless communications, and have been selected for uplink and downlink enhanced Mobile Broadband (eMBB) control channel coding for the new $5^{th}$ Generation (5G) air interface, also known as the 5G New Radio (NR). These codes are competitive with state-of-the-art error correction codes and have low encoding complexity. See E. Arikan, "Channel polarization: A method for constructing capacity-achieving codes for symmetric binary-input memoryless channels," IEEE Trans. Inf. Theory, vol. 55, no. 7, pp. 3051-3073, 2009. Successive Cancellation (SC) decoding and its extensions (e.g., SC List decoding) are effective and efficient options for decoding polar coded information.

Based on channel polarization, Arikan designed a channel code that is proven to reach channel capacity. Polarization refers to a coding property that, as code length increases to infinity, bit-channels also referred to as sub-channels polarize and their capacities approach either zero (completely noisy channel) or one (completely perfect channel). In other words, bits encoded in high capacity sub-channels will experience a channel with high Signal-to-Noise Ratio (SNR), and will have a relatively high reliability or a high likelihood of being correctly decoded, and bits encoded in low capacity sub-channels will experience a channel with low SNR, and will have low reliability or a low possibility to be correctly decoded. The fraction of perfect sub-channels is equal to the capacity of a channel.

Although Polar codes have already been adopted in the enhanced mobile broadband part of the new 5G standard, currently adopted polar codes are limited in their native codeword length since they can only exist in lengths of powers of 2. Nevertheless, practical applications require an error correction code with a flexible codeword length.

SUMMARY

The provided systems and methods of communicating using asymmetric polar codes overcome the codeword length constraints of systems and methods of communicating that use traditional polar codes. Used herein, asymmetric polar codes refers to a polarizing linear block code of any arbitrary length that is constructed by connecting together constituent polar codes of unequal length. Asymmetric polar codes may be known by other names. In comparison to conventional solutions for variable codeword length, asymmetric polar codes may provide more flexibility, improved performance, and/or reduced complexity of decoding, encoding, or code design. The disclosure aims to provide a system and method of communicating using a polar code with a flexible, universal, and well-defined coding scheme and to provide sound bit-error correction performance and low decoding latency (compared with current length-compatible methods which can be used with current hardware designs). For the most part, the provided embodiments can be implemented with nearly all available current encoding/decoding polar code techniques.

Illustrative embodiments are disclosed by way of example in the description and claims.

According to a first broad aspect, the disclosure provides a method comprising: obtaining input bit sequence, the input bit sequence containing N1+N2 bits, the input bit sequence including information bits and frozen bits, where N1 and N2 are different powers of a polar code kernel size; polar encoding N1 bits of the input bit sequence with a first constituent polar encoder to produce a set of N1 polar encoded bits; polar encoding remaining N2 bits of the input bit sequence with a second constituent polar encoder, to produce a set of N2 polar encoded bits; combining at least some of the N1 polar encoded bits with at least some of the N2 polar encoded bits with a first additional polarizing stage to produce a set of N1 combined bits; generating an asymmetric polar code codeword of length N1+N2 consisting of the set of N1 combined bits and the N2 polar encoded bits.

Optionally, for the above described embodiment, the method further involves polar encoding the N1 bits, polar encoding the remaining N2 bits, combining the N1 polar encoded bits with N1 of the N2 polar encoded bits, and generating the asymmetric polar encoded codeword comprises multiplying the input bit sequence by a generator matrix.

Optionally, for any of the above described embodiments, the method further involves transmitting the asymmetric polar code codeword over a wireless channel.

Optionally, for any of the above described embodiments, transmitting the N2 polar encoded bits; receiving feedback from which it can be concluded that the N2 polar encoded bits were not decoded successfully; in response to receiving the feedback, transmitting the set of N1 combined bits.

Optionally, for any of the above described embodiments, N1<N2, and the first additional polarization stage is the same as a last set of connections and XOR operations of a polar code encoder of a size $K^{N1+1}$, where K is the size of the polar code kernel, such that the combined set of bits is based on the N1 polar encoded bits and N1 of the N2 polar encoded bits.

Optionally, for any of the above described embodiments, N1>N2, and the first additional polarization stage includes part of a last set of connections and XOR operations of a polar code encoder of a size $K^{N1+1}$, where K is the size of the polar code kernel, such that the combined set of bits includes N2 of the N1 polar encoded bits combined with the N2 polar encoded bits and includes remaining N1-N2 of the N2 polar encoded bits.

Optionally, for any of the above described embodiments, the method comprises encoding $N_A$ input bits with a length asymmetric $N_A$ polar code encoder by: for each of a plurality of p subsets of the input bits having lengths $N_0, N_1, \ldots, N_{p-1}$ which sum to $N_A$, where p>=3, polar code encoding the subset with a respective constituent polar code encoder; linking together the outputs of the constituent polar code encoders recursively with additional polarizing stages such that each constituent polar code $N_i$ is linked with the next constituent code $N_{i+1}$ in sequence for i=0, 1, ..., p-2, wherein the additional polarizing stage used for linking in each iteration is the same XOR transform which is used for last stage of an Arikan polar code of length $2N_{i+1}$. The subsets consist of a first subset containing the N1 bits, and a subset containing the N2 bits and p−2 further subsets. The constituent polar code encoders consist of the first constituent polar code encoder, the second constituent polar code encoder and p−2 further constituent polar code encoders. The additional polarization stages are inclusive of the first additional polarization stage and p−2 further additional polarization stages.

Optionally, for any of the above described embodiments, the method further comprises adapting a value $N_A$, where $N_A$=N1+N2 based on feedback.

According to a second broad aspect, the disclosure provides a method that involves encoding an input vector with an original polar code encoder to produce an initial codeword, wherein the original polar code encoder is an asymmetric polar code encoder or an asymmetric polar code codeword; transmitting the initial codeword; receiving feedback from which it can be concluded that the initial codeword was not decoded successfully; generating an extended input vector by extending the input vector to include an extension vector that comprises at least one redundancy bit; encoding the extended input vector with an asymmetric polar code encoder based on a combination of the original polar code encoder, a further polar code encoder having a size equal to the size of the extension vector, and a further polarizing stage that links outputs of the original polar code encoder and the further polar code encoder; and transmitting an output of the further polarizing stage.

According to a third broad aspect, the disclosure provides an apparatus that includes an input that obtains an input bit sequence containing N1+N2 bits including information bits and frozen bits, where N1 and N2 are different powers of a polar code kernel size; a first polar code encoder that polar encodes N1 bits of the input bit sequence with a first constituent polar encoder to produce a set of N1 polar encoded bits; a second polar code encoder that polar encodes remaining N2 bits of the input bit sequence with a second constituent polar encoder, to produce a set of N2 polar encoded bits; a first additional polarizing stage that combines at least some of the N1 polar encoded bits with at least some of the N2 polar encoded bits to produce a set of N1 combined bits; a codeword generator that generates an asymmetric polar code codeword of length N1+N2 consisting of the set of N1 combined bits and the N2 polar encoded bits; and a transmitter that transmits the asymmetric polar code codeword over a wireless channel.

Optionally, the transmitter transmits the asymmetric polar code codeword by: transmitting the N2 polar encoded bits; receiving feedback from which it can be concluded that the N2 polar encoded bits were not decoded successfully; and, in response to receiving the feedback, transmitting the set of N1 combined bits.

Optionally, N1<N2, and the first additional polarization stage is the same as a last set of connections and XOR operations of a polar code encoder of a size $K^{N1+1}$, where K is the size of the polar code kernel, such that the combined set of bits is based on the N1 polar encoded bits and N1 of the N2 polar encoded bits.

Optionally, N1>N2, and the first additional polarization stage includes part of a last set of connections and XOR operations of a polar code encoder of a size $K^{N1+1}$, where K is the size of the polar code kernel, such that the combined set of bits includes N2 of the N1 polar encoded bits combined with the N2 polar encoded bits and includes remaining N1-N2 of the N2 polar encoded bits.

According to a fourth broad aspect, the disclosure provides an apparatus comprising an original polar code encoder that encodes an input vector to produce an initial codeword, wherein the original polar code encoder is an asymmetric polar code encoder or an asymmetric polar code codeword; a transmitter that transmits the initial codeword; a receiver that receives feedback from which it can be concluded that the initial codeword was not decoded successfully; an extended input vector generator that generates an extended input vector by extending the input vector to include an extension vector that comprises at least one redundancy bit; an asymmetric polar code encoder that encodes the extended input vector, wherein the asymmetric polar code encoder is based on a combination of the original polar code encoder, a further polar code encoder having a size equal to the size of the extension vector, and a further polarizing stage that links outputs of the original polar code encoder and the further polar code encoder. The transmitter further transmits an output of the further polarizing stage.

According to a fifth broad aspect, the disclosure provides an apparatus comprising a processor, memory and a transceiver. The memory containing instructions that when executed cause performance of any of the methods summarized above.

According to a sixth broad aspect, the disclosure provides a method that comprises receiving an asymmetric codeword transmitted in accordance with one of the summarized methods; and decoding the asymmetric codeword.

According to a seventh broad aspect, the disclosure provides a method that involves receiving an initial codeword based on encoding an input vector with an original polar code encoder to produce the initial codeword, wherein the original polar code encoder is an asymmetric polar code encoder or an asymmetric polar code codeword; attempting to decode the initial codeword; upon failure to decode the initial codeword, transmitting feedback from which it can be concluded that the initial codeword was not decoded successfully; receiving an output from a further polarization stage based on encoding an extended input vector that extends the input vector to include an extension vector that comprises at least one redundancy bit, the encoding having been performed with an asymmetric polar code encoder based on a combination of the original polar code encoder, a further polar code encoder having a size equal to the size of the extension vector, and a further polarizing stage that links outputs of the original polar code encoder and the further polar code encoder; attempting to decode the initial codeword in combination with the output from the further polarization stage.

According to a eighth broad aspect, the disclosure provides an apparatus comprising: a processor, memory and a transceiver; the memory containing instructions that when executed cause performance of the method summarized above.

Other aspects and features of embodiments of the present disclosure will become apparent to those ordinarily skilled in the art upon review of the following description.

BRIEF DESCRIPTION OF THE DRAWINGS

Examples of embodiments of the invention will now be described in greater detail with reference to the accompanying drawings.

FIG. 1 is a diagram showing one example of how a polar coding generator matrix can be produced from a kernel.

FIG. 17A depicts an example of the use of an asymmetric polar code for HARQ incremental redundancy.

FIG. 18 is an example of Fast-SSC decoding applied to asymmetric polar code.

FIG. 25 is an example equation of generator matrix construction for an asymmetric code of length $N_A$.

DETAILED DESCRIPTION

Figure 2:
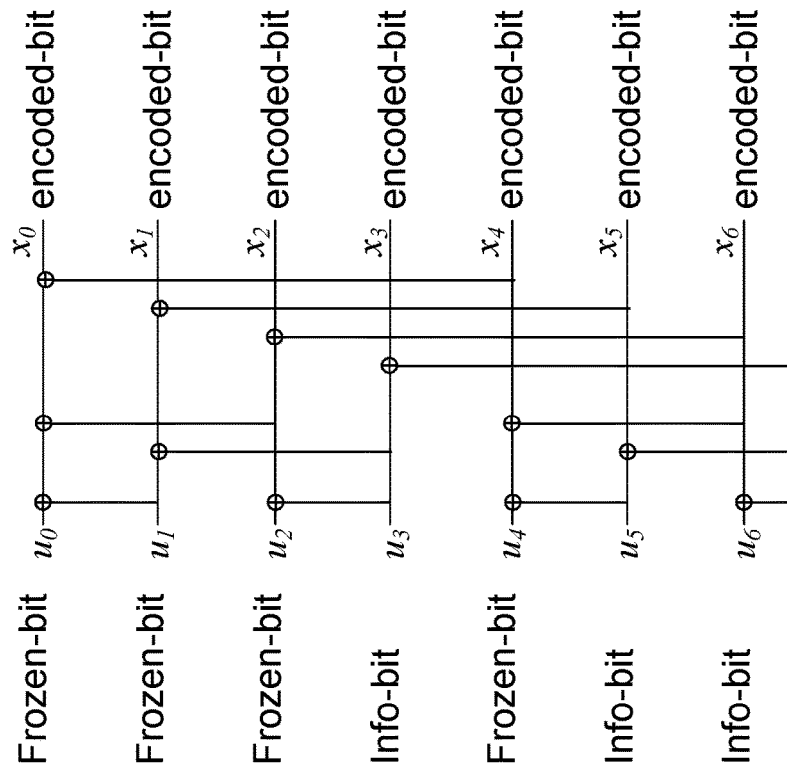
FIG. 2 is a diagram showing an example use of a polar coding generator matrix for producing codewords and a schematic illustration of an example polar encoder.

The state of the art with respect to flexible codeword length of a polar code consists of puncturing/shortening methods and multi-kernel polar codes.

In a typical polar code, a 2×2 polarizing matrix $G_2$, is expanded using a Kronecker product of itself to produce generator matrices of size 4×4, 8×8 etc, thereby restricting the codeword length of polar codes to be power of 2. The $G_2$ polarizing matrix is also known as the Arikan kernel.

FIG. 1 is a diagram showing, by way of an illustrative example, how polar coding generator matrices of different codeword lengths can be produced from a kernel $G_2$ 100. Note that FIG. 1 is an example. Other forms of kernel are also possible.

A polar code can be formed from a Kronecker product matrix based on a seed matrix $F=G_2$ 100. For a polar code having codewords of length $N=2^m$, the generator matrix is $G_2^{\otimes m}$. The 2-fold Kronecker product matrix $G_2^{\otimes 2}$ 102 and the 3-fold Kronecker product matrix $G_2^{\otimes 3}$ 104 in FIG. 1 are examples of polar coding generator matrices. The generator matrix approach illustrated in FIG. 1 can be expanded to produce an m-fold Kronecker product matrix $G_2^{\otimes m}$.

Puncturing/shortening allows for a polar code to have any codeword length. It uses a traditional polar code (i.e., of length equal to a power of 2, as in FIG. 1) as a "mother code", and then pre-freezes some particular bit positions and determines some coded bits that will not be transmitted over channels. Accordingly, the decoder must know these pre-frozen bit positions before injecting appropriate data into the mother decoder at those bit positions. Ostensibly, punctured/shortening scheme still exploits a typical length-limited polar code as the encoder/decoder. It is less efficient from a computing resource perspective, because any given codeword length N must decode a polar code of length 2ceil(log 2N). For example, a punctured/shortened polar code length of 768 must be decoded by a mother polar code of length 1024. Additionally, puncturing/shortening scheme adds overhead to polar coding scheme by having to cooperatively optimize the punctured/shortened coded bits and pre-frozen bit positions.

Multi-kernel polar codes use additional "kernels" along with the common ($G_2$) Arikan kernel. These additional kernels, such as a 3×3 $G_3$ ternary kernel, enable polar codes to have a higher flexibility in native length. For example, a polar code of length 6 could be encoded with a 6×6 generator matrix that is formed with the Kronecker product of the $G_1$ and $G_3$ kernels. However, multi-kernel polar codes also suffer from certain disadvantages. For example, the order of the kernels in the Kronecker product affects the generator matrix, leading to an additional parameter to be optimized. And while multi-kernel polar codes using the $G_3$ kernel can allow any codeword length which is a power of 2, power of 3, or a combination of both, multi-kernel codes with a finite number of unique kernels do not allow for any arbitrary block length. Furthermore, multi-kernel codes have increased system complexity. The decoding process requires additional processing units to decode the ternary kernel, and additional memory to store partial sum data and the order of the kernels. Multi-kernel codes also require consideration for the method of frozen set design, which differs slightly from that of traditional polar codes.

FIG. 2 is a diagram showing an example use of a polar coding generator matrix for producing codewords and a schematic illustration of an example polar encoder. In FIG. 2, the generator matrix $G_2^{\otimes 3}$ 104 is used to produce codewords of length $2^3=8$. A codeword x is formed by the product of an input vector $u=[0\ 0\ 0\ u_3\ 0\ u_5\ u_6\ u_7]$ and the generator matrix $G_2^{\otimes 3}$ 104 as indicated at 200. The input vector u is composed of information bits and fixed or frozen bits. In the specific example shown in FIG. 2, N=8, so the input vector u is an 8-bit vector, and the codeword x is an 8-bit vector. The input vector has frozen bits in positions 0, 1, 2 and 4, and has information bits at positions 3, 5, 6, and 7. An example implementation of an encoder that generates codewords is indicated at 212, where the frozen bits are all set to 0, and the circled "+" symbols represent modulo 2 addition. For the example of FIG. 2, an N=8-bit input vector is formed from K=4 information bits and N−K=4 frozen bits. Codes of this form are referred to as polar codes and the encoder is referred to as a polar encoder. Decoders for decoding polar codes are referred to as polar decoders. Frozen bits are set to zero in the example shown in FIG. 2. However, frozen bits could be set to other bit values that are known to both an encoder and a decoder. For ease of description, all-zero frozen bits are considered herein, and may be generally preferred.

As is known, polar coding may be performed with or without bit reversal. The example polar encoder in FIG. 2 is without bit reversal.

Generally, the output of a polar encoder can be expressed as $x_0^{N-1} = u_0^{N-1} G_N$, where, without bit reversal, $G_N = F^{\otimes n}$ is an N-by-N generator matrix, $N=2^N$, $n \geq 1$ (e.g. for n=1, $G_2 = F$ (indicated as 100 in FIG. 1)). For bit reversal, $G_N = B_N F^{\otimes n}$, where $B_N$ is an N-by-N bit-reversal permutation matrix.

Embodiments disclosed herein could be implemented without or with bit reversal.

In polar code construction, ideally the more "reliable" positions of an input vector are used to carry the information bits, and the more "unreliable" positions of an input vector are used to carry the frozen bits (i.e., bits already known to both encoder and decoder). However, when information is transmitted over a physical channel, the reliability of a given bit position is also a function of the characteristics of the physical channel, such as the erasure rate or the Signal-to-Noise Ratio (SNR) of the physical channel. A reliability sequence (reliable and unreliable positions) could be calculated based on assumed or measured characteristics of the physical channel before the information is transmitted over the channel, for example. In theory, the frozen bits can be set to any value as long as the location and value of each frozen bit is known to both the encoder and the decoder. In conventional applications, the frozen bits are all set to zero.

With a sufficiently long code length, a code designed according to polarization theory can reach the channel capacity in a binary symmetric memoryless channel if a Successive Cancellation (SC) based decoding algorithm is used. A very simple SC decoding algorithm was analyzed and simulated by Arikan.

In practice, a code length cannot be infinite and a channel cannot be a binary memoryless channel, and therefore channel capacity cannot be reached by such a simple SC decoder. According to Arikan, the channel capacity can be approached when using SC decoding if a code length is over $2^{20}$ bits in an AWGN channel. Such a long code length is impractical in wireless communications, for example.

Assistant or error-detecting code (EDC) bits can be included in the input vector to assist in decoding. A cyclic redundancy check (CRC) code could be used as an EDC. More than one EDC could be used within one codeword. However, it should be understood that other EDCs, such as a checksum code or a Fletcher Code, may be used. Some EDCs are also error-correcting codes (ECCs).

CRC bits, for example, are generated based on the information bits being transmitted. CRC bits are generally placed in more reliable positions in the input vector, although CRC bits may also or instead be placed in other positions in the input vector. CRC bits may be used in path selection for List decoding, for example, to improve polar code performance, or to detect whether one codeword is decoded correctly during or after the decoding. During encoding, an N-bit input vector could be formed from K information bits including one or more CRC bits, and (N−K) frozen bits. In this example, starting with a number of input bits, a CRC is calculated and appended to the input bits to produce a set of K information bits including the input bits and the CRC bits. The remaining (N−K) frozen bits are inserted to produce an N-bit input vector. The input vector is then multiplied by a generator matrix fpr a polar code to produce an N-bit codeword.

The codeword is transmitted over a channel, and a receiver, in turn, receives a word. Due to channel effects such as noise, the received word might not be identical to the transmitted codeword. A decoder attempts to decode the received word to determine information bits in the original input vector.

During decoding of a codeword encoded from an input vector, the locations and values of frozen bits in the input vector are treated as known. For descriptive simplicity, bits of the input vector that are not known to the decoder in advance will be referred to as "unknown" bits. For example, the information bits including any CRC bits are unknown bits. Some polar decoders use SC decoding as noted above, in which the unknown bits are decoded sequentially and successive cancellation is applied. Once a particular decision has been made regarding how an unknown bit is to be decoded, SC polar decoders do not allow that bit to be changed or corrected, and the decoder moves on to decoding the next unknown bit.

An extension of SC polar decoding algorithm with better error correction performance, referred to as List or SCL decoding, is described in "List Decoding of Polar Codes" by Tal and Vardy, *Proceedings of the* 2011 *IEEE International Symposium on Information Theory*, pp. 1-5 (July 2011). In a List decoder, successive levels of a binary decision tree are generated, each level corresponding to a decision on a respective unknown bit. Each (decoding) path in the decision tree from the root node to leaf nodes represents a possible partial decoded sequence of unknown bits and has a corresponding likelihood. Typically, during generation of the decision tree, at each level of the decision tree where the number of paths grows beyond a set threshold L, the L paths having the highest likelihoods are identified, and the remaining paths are discarded. Some List decoders may also make use of CRC bits included in the codeword to assist in decoding. For example, if the codeword includes encoded CRC bits for the previous information bits, then once the decision tree is generated, each of the surviving paths that corresponds to decoded information bits is checked against the CRC bits represented in each of those surviving paths. The decoder then outputs as a decoded vector the information bits in the surviving path that passes the CRC check. If more than one path passes the CRC check, then the decoder selects for output the path that passes the CRC check and has the highest likelihood, which may be determined according to a metric. If no path passes the CRC check, or if the codeword does not include encoded CRC bits, then the decoder selects for output the path that has the highest likelihood, which as noted above may be determined according to a metric.

Thus, there are two types of the decoding based on successive cancellation: SC decoding and List decoding. SC decoding is a special case of SCL decoding, with list size L=1. An SC decoder tracks only one decoding path. After the value of a decoded bit is estimated, the other possible value is ignored. Decoding continues with the next bit, assuming that each previous bit has been correctly estimated when updating partial sum results.

Figure 3:
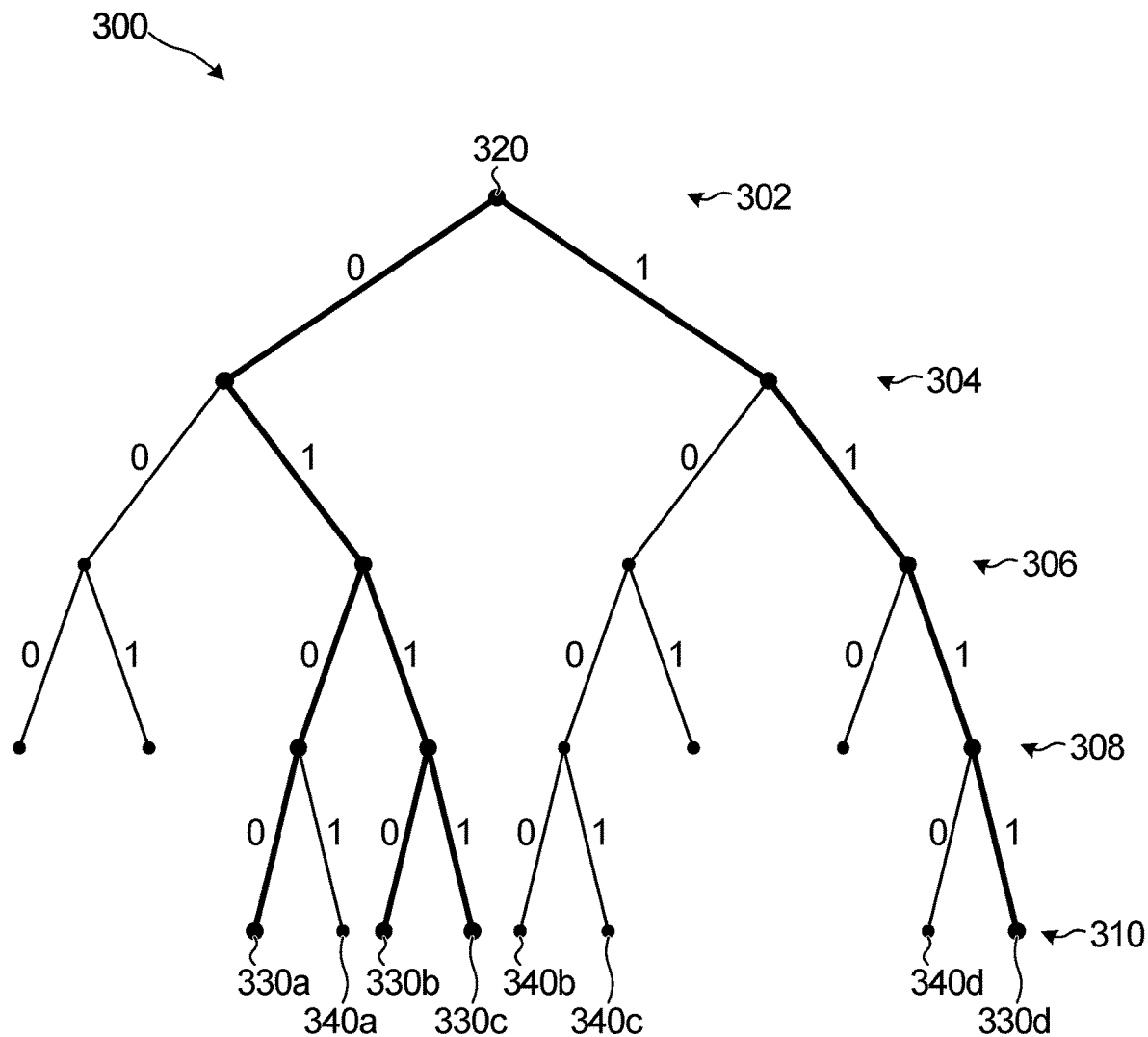
FIG. 3 is a diagram showing a portion of an example decision list tree whose width is limited by a maximum given list size and used in a Successive Cancellation List (SCL) polar decoder.

FIG. 3 is a diagram showing a portion of an example decision list tree 300 used in an SCL polar decoder, whose width is limited by a maximum given list size L. In FIG. 3 the list size L is 4. Five levels 302, 304, 306, 308, 310 of the decision tree are illustrated. Although five levels are illustrated, it should be understood that a decision tree to decode K information bits (including CRC bits) would have K+1 levels. At each level after the root level 302, each one of up to 4 surviving decoding paths is extended by one bit. The leaf or child nodes of root node 320 represent possible choices for a first bit, and subsequent leaf nodes represent possible choices for subsequent bits. The decoding path from the root node 320 to leaf node 330*a*, for example, represents an estimated codeword bit sequence: 0, 1, 0, 0. At level 308, the number of possible paths is greater than L, so L paths having the highest likelihood (e.g. best Path Metrics) are identified, and the remaining paths are discarded. The decoding paths that survive after the path sort at level 306 are shown in bold in FIG. 3. Similarly, at level 310, the number of possible paths is again greater than L, so the L paths having the highest likelihood (best PMs) are identified, and the remaining paths are again discarded. In the example shown, the paths terminating in leaf nodes 330*a*, 330*b*, 330*c*, and 330*d* represent the highest likelihood paths. The paths terminating in leaf nodes 340*a*, 340*b*, 340*c*, 340*d* are the lower likelihood paths which are discarded.

SCL decoding can be further divided into pure list decoding in which survivor paths with the highest likelihood are selected and CRC-Aided SCL (CA-SCL) decoding where CRC bits are used for path selection. A CRC may provide better error correction performance in the final path selection, but is optional in SCL decoding. Other decoding-assistant operations, such as a Parity Check (PC) based on parity or "PC" bits that are included in an input vector, could be used instead of or jointly with CRC bits in path selection during decoding or in the final path selection.

In an Additive White Gaussian Noise (AWGN) channel, a polar code in effect divides the channel into N sub-channels. A key to code construction for a polar code is to determine which bit-channels, also referred to herein as sub-channels, are selected or allocated for information bits and which sub-channels are allocated for frozen bits. In some embodiments, one or more sub-channels are also allocated to PC, CRC, and/or other types of bits that are used to assist in decoding. In terms of polarization theory, the sub-channels that are allocated for frozen bits are called frozen sub-channels, the sub-channels that are allocated for information bits are called information sub-channels, and additional assistant sub-channels may be allocated to assistant bits that are used to assist in decoding. In some embodiments, assistant bits are considered to be a form of information bits, for which more reliable sub-channels are selected or allocated.

Figure 4:
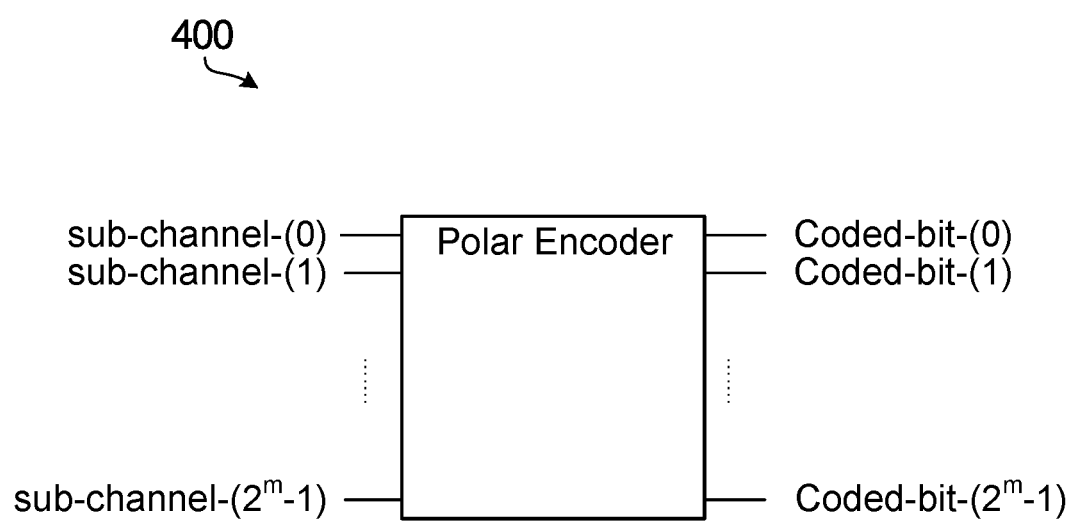
FIG. 4 is a block diagram illustrating an example of a polar encoder based on a 2-by-2 kernel.

Polar encoders based on Kronecker products of a 2-by-2 Arikan kernel $G_2$ are described above. FIG. 4 is a block diagram illustrating an example of a polar encoder 400 according to embodiments of the present disclosure. Sub-channels and coded bits are labeled in FIG. 4. A channel is divided into N sub-channels by a polar code as noted above. An information block and frozen bits are allocated onto the N sub-channels, and the resultant N-sized vector is multiplied with a generator matrix by the polar encoder 400 to generate a codeword that includes N coded bits. An information block includes at least information bits and could also include assistant bits such as CRC bits or PC bits. A sub-channel selector (not shown) could be coupled to the polar encoder 400 to select sub-channels for information bits and any assistant bits, with any remaining sub-channels being frozen sub-channels.

As a result of SC, SCL, or CA-SCL decoding, the polarization phenomenon appears over the synthesized sub-channels. Some synthesized sub-channels have high capacity, and some sub-channels have low capacity. Put another way, some synthesized sub-channels have equivalently high Signal-to-Noise Ratio (SNR) and others have equivalently low SNR. These metrics are examples of characteristics that could be used to quantify or classify sub-channel "reliability". Other metrics indicative of sub-channel reliability can also be used.

Code construction involves determining a code rate (the number of information bits K, or how many sub-channels are to carry information bits) and selecting the particular K sub-channels among the N available sub-channels that are to carry information bits. For ease of reference herein, information bits could include input bits that are to be encoded, and possibly CRC bits, PC bits, and/or other assistant bits that are used to assist in decoding. Sub-channel selection is based on reliabilities of the sub-channels, and typically the highest reliability sub-channels are selected as information sub-channels for carrying information bits.

Sub-channel reliabilities could be specified, for example, in one or more ordered sequences. A single, nested, SNR-independent ordered sequence of sub-channels could be computed for a code length $N_{max}$, with ordered sequences for shorter code lengths N being selected from the longer $N_{max}$ sequence. Multiple ordered sequences in terms of different mother code lengths $N_i$ could instead be computed, and one of the mother code length sequences could be selected for a particular code based on preferred code length. Another possible option involves computing multiple ordered sequences in terms of SNR values, for example, and selecting an ordered sequence based on measured SNR.

Figure 5:
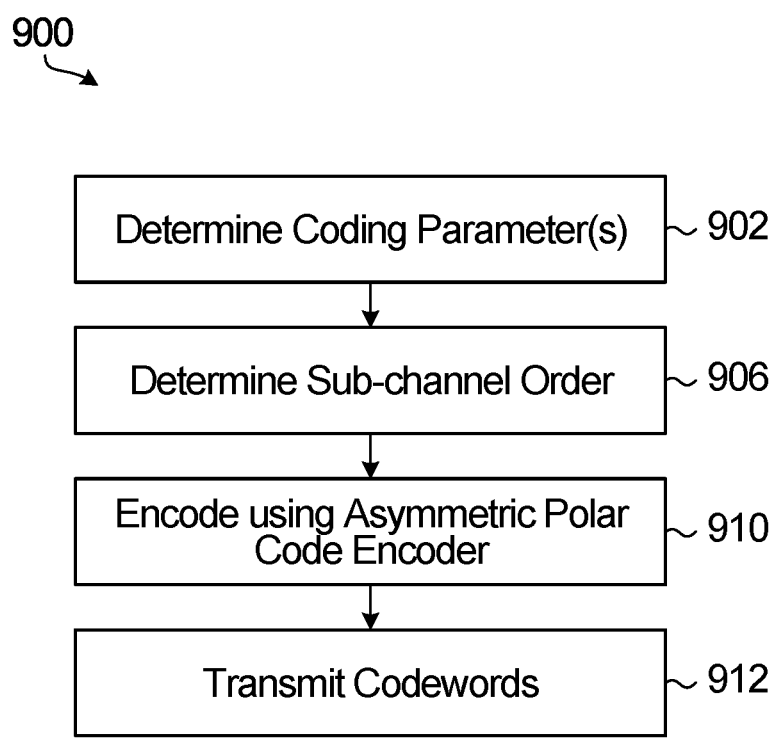
FIG. 5 is a flow diagram of an example coding method according to an embodiment.

FIG. 5 is a flow diagram of an example coding method according to an embodiment. The illustrated example method 900 includes determining one or more coding parameters at 902. The coding parameter(s) could include at least a mother code length N, which could be read from memory or otherwise provided. N could be computed based on a given K and a given code rate R, for example. At 906, a reliability order of sub-channels is determined, for example using one of the methods detailed above. A rule set could be used to reduce the number of reliability computations and polynomial comparisons that are involved in determining sub-channel order at 906, for example, which could make it feasible to determine sub-channel order online when information is to be encoded or decoded.

An ordered sub-channel sequence as determined at 906 could be used to select information sub-channels, frozen sub-channels, and/or other types of sub-channels when information is to be encoded at 910 using an asymmetric polar code encoder as detailed below. Codewords are then transmitted at 912.

The example method in FIG. 5 is intended for illustrative purposes. Other embodiments could involve performing the illustrated operations in any of various ways, performing fewer or additional operations, and/or varying the order in which operations are performed.

Figure 6:
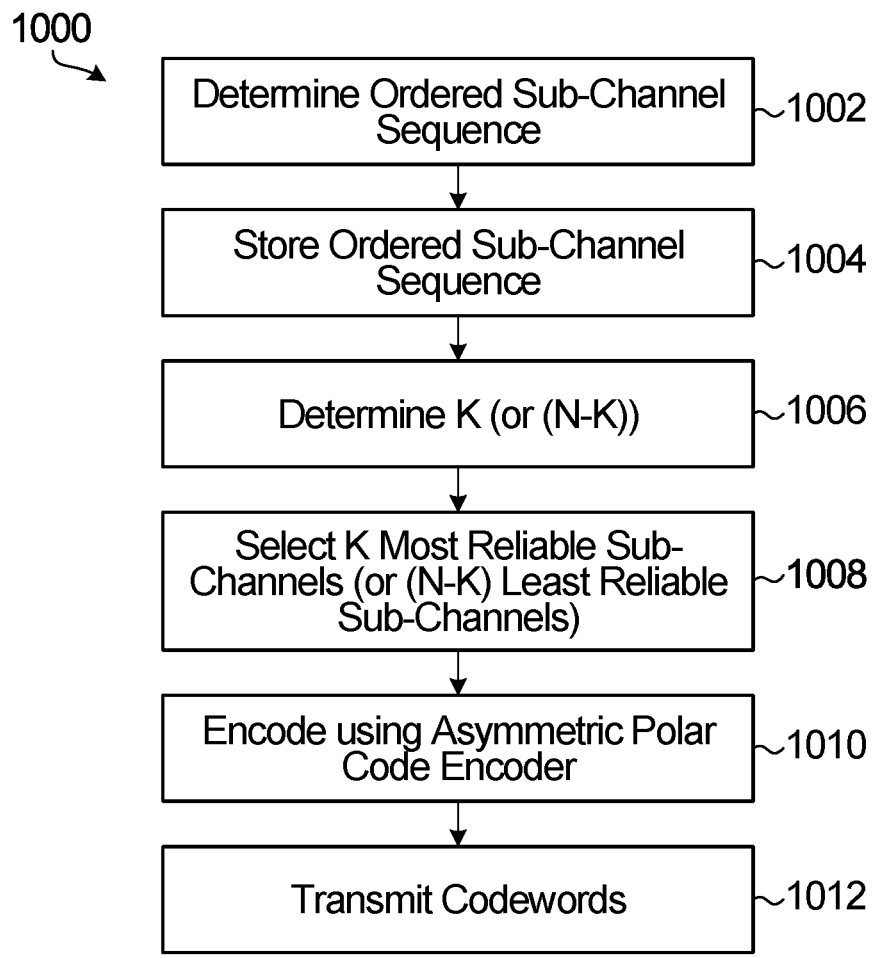
FIG. 6 is a flow diagram of an example coding method according to a further embodiment.

FIG. 6 is a flow diagram of an example of such a coding method 1000 according to a further embodiment. The example method 1000 involves determining an ordered sequence of sub-channels at 1002 and storing the determined ordered sub-channel sequence at 1004. In some implementations, these steps may be optional and/or performed in advance, separately from other coding operations in coding method 1000. For example, the coding method 1000 may instead simply include determining an ordered sub-channel sequence at 1002 by retrieving or reading the stored the ordered sub-channel sequence from memory. Other possibilities exist.

One or more coding parameters, which could include K or (N−K) depending on the type of sub-channels to be selected, is determined at 1006, and examples of operations that could be involved in determining K or (N−K) are described above. At 1008, K most reliable sub-channels, or (N−K) least reliable sub-channels, of the N sub-channels are selected. The asymmetric polar code encoding at 1010 involves encoding input bits onto the K most reliable sub-channels, according to the selection at 1008. Codewords that are generated by the asymmetric polar code encoding at 1010 are transmitted at 1002.

Figure 9:
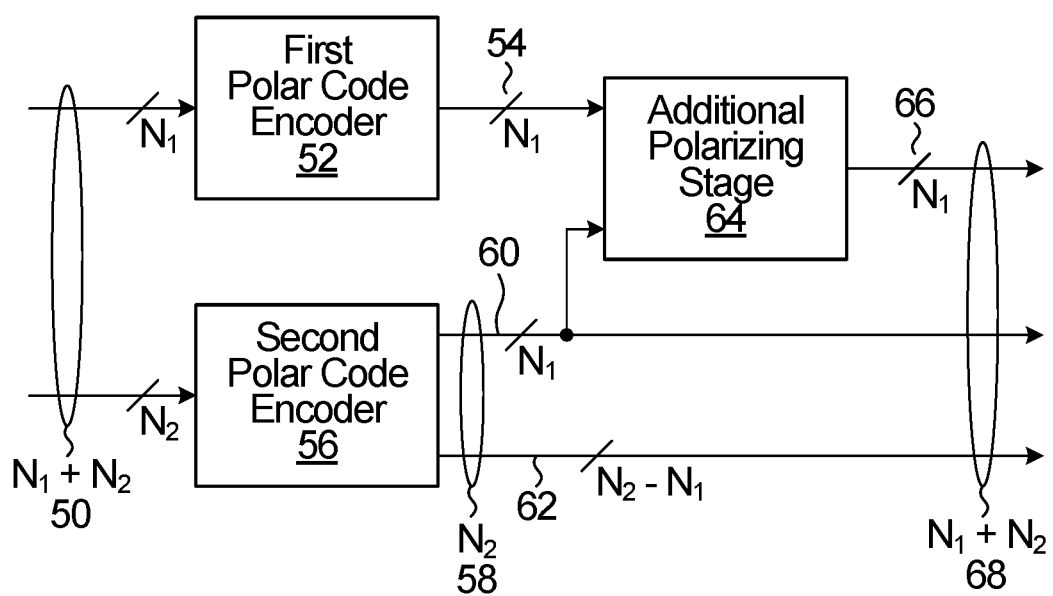
FIG. 9 is a block diagram of an asymmetric polar code encoder provided by an embodiment of the disclosure.
Figure 10:
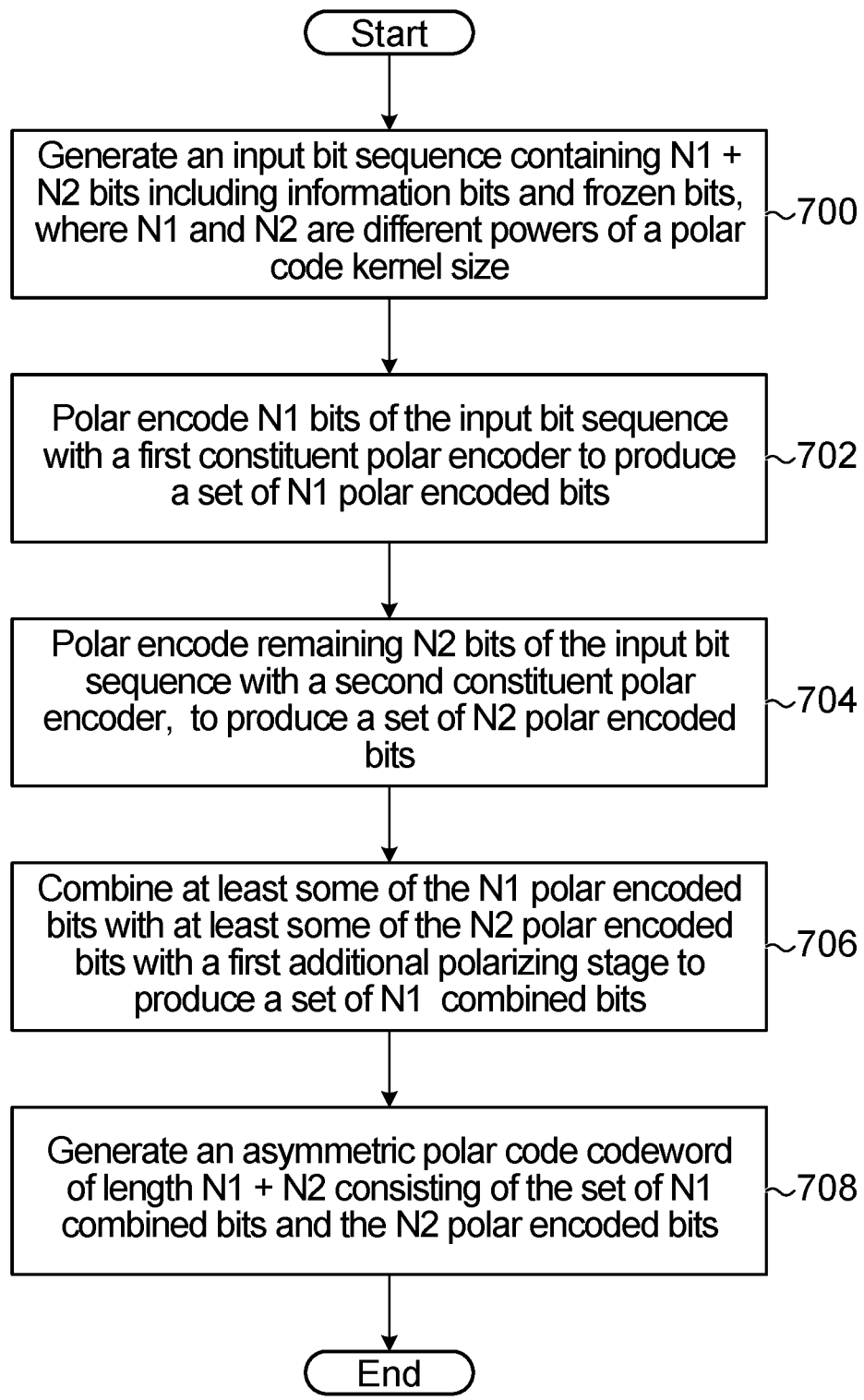
FIG. 10 is a flowchart of a method of asymmetric polar code encoding provided by an embodiment of the disclosure.

The example method 1000 is intended for illustrative purposes. Other embodiments could involve performing the illustrated operations in any of various ways, performing fewer or additional operations, and/or varying the order in which operations are performed. Other variations could be or become apparent to a skilled person based on the present disclosure. For example, any one or more of the following could be provided, alone or in any of various combinations, in embodiments:

Although FIGS. 9, 10 show example operations that would be performed at an encoder (or transmitter), other embodiments could be implemented at a decoder (or receiver). A word that is based on a codeword of a code could be received at a receiver and decoded, based on sub-channels that are selected by the decoder or a sub-channel selector coupled to the decoder according to a method as shown in any of FIGS. 9, 10 and/or as otherwise disclosed herein.

In another embodiment, a non-transitory processor-readable medium stores instructions which, when executed by one or more processors, cause the one or more processors to perform a method as disclosed herein.

Figure 7:
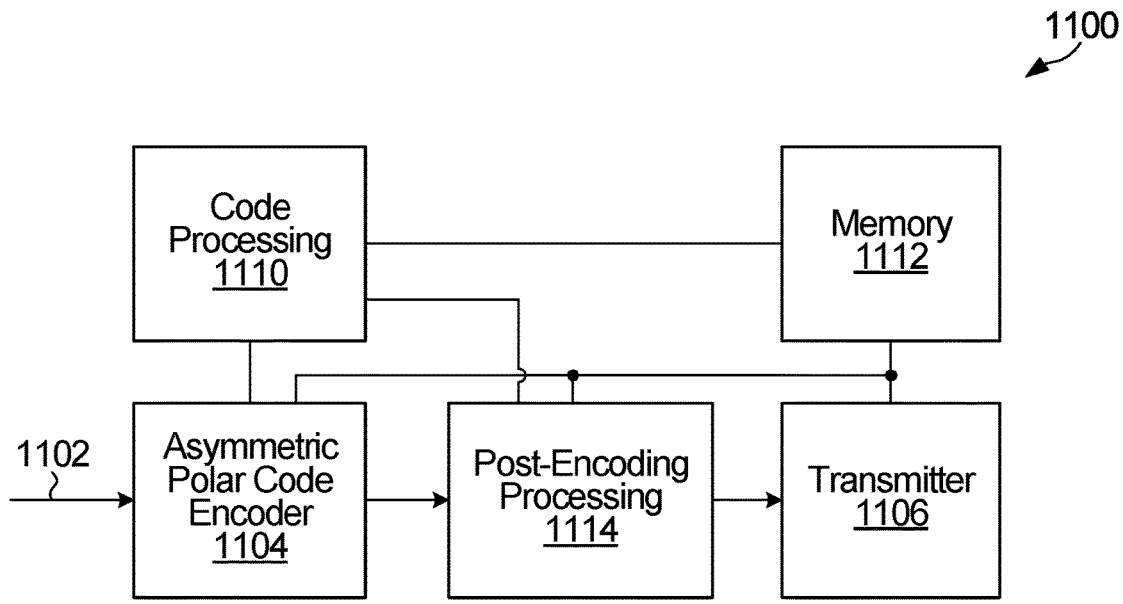
FIG. 7 is a block diagram of an apparatus for encoding and transmitting codewords.

FIG. 7 is a block diagram of an apparatus for encoding and transmitting codewords. The apparatus 1100 includes an asymmetric polar code encoder module 1104 coupled to a transmitter module 1106. The apparatus 1100 also includes a code processing module 1110 coupled to the asymmetric polar code encoder module 1104 and a post-encoding processing module 1114. The post-encoding processing module 1114 is also coupled to the asymmetric polar code encoder module 1104 and to the transmitter module 1106. A memory 1112, also shown in FIG. 7; is coupled to the asymmetric polar code encoder module 1104, to the code processing module 1110, to the post-encoding processing module 1114, and to the transmitter module 1106. Although not shown, the transmitter module 1106 could include a modulator, an amplifier, antenna and/or other modules or components of a transmit chain or alternatively could be configured to interface with a separate (Radio-Frequency—RF) transmission module. For example, some of all of the modules 1104, 1106, 1110, 1112, 1114 of the apparatus 1100 may be implemented in hardware or circuitry (e.g. in one or more chipsets, microprocessors, application-specific integrated circuits (ASIC), field-programmable gate arrays (FPGAs), dedicated logic circuitry, or combinations thereof) so as to produce codewords as described herein for transmission by a separate (RF) unit.

In some embodiments, the memory 1112 is a non-transitory computer readable medium at 1112, that includes instructions for execution by a processor to implement and/or control operation of the code processing module 1110, the asymmetric polar code encoder module 1104, the post-encoding processing module 1114, the transmitter module 1106 in FIG. 7, and/or to otherwise control the execution of functionality and/or embodiments described herein. In some embodiments, the processor may be a component of a general-purpose computer hardware platform. In other embodiments, the processor may be a component of a special-purpose hardware platform. For example, the processor may be an embedded processor, and the instructions may be provided as firmware. Some embodiments may be implemented by using hardware only. In some embodiments, the instructions for execution by a processor may be embodied in the form of a software product. The software product may be stored in a non-volatile or non-transitory storage medium, which could be, for example, a compact disc read-only memory (CD-ROM), universal serial bus (USB) flash disk, or a removable hard disk, at 1112.

In some embodiments, the asymmetric polar code encoder module 1104 is implemented in circuitry, such as a processor, that is configured to encode input bits as disclosed herein. In a processor-based implementation of the asymmetric polar code encoder module 1104, processor-executable instructions to configure a processor to perform encoding operations are stored in a non-transitory processor-readable medium. The non-transitory medium could include, in the memory 1112 for example, one or more solid-state memory devices and/or memory devices with movable and possibly removable storage media.

The code processing module 1110 could be implemented in circuitry that is configured to determine coding parameters such as mother code block length, and to determine an ordered sub-channel sequence as disclosed herein. In some embodiments, the code processing module 1110 is implemented using a processor. The same processor or other circuitry, or separate processors or circuitry, could be used to implement both the asymmetric polar code encoder module 1104 and the code processing module 1110. As noted above for the asymmetric polar code encoder module 1104, in a processor-based implementation of the code processing module 1110, processor-executable instructions to configure a processor to perform code processing operations are stored in a non-transitory processor-readable medium, in the memory 1112 for example.

Like the asymmetric polar code encoder module 1104 and the code processing module 1110, the post-encoding processing module 1114 is implemented in circuitry, such as a processor, that is configured to perform various post-encoding operations. These post-encoding operations could include rate-matching operations such as puncturing, shortening and/or interleaving, for example. In a processor-based implementation of the post-encoding processing module 1114, processor-executable instructions to configure a processor to perform post-encoding operations are stored in a non-transitory processor-readable medium, examples of which are described above. Information indicative of bit positions and/or sub-channels that are affected by post-encoding operations, or information from which such bit positions or sub-channels may be determined, may be fed back to the code processing module 1110, stored to the memory 1112, or otherwise made available to the code processing module 1110 by the post-encoding processing module 1114.

In some embodiments of the code processing module 1110, the coding parameters and/or the ordered sub-channel sequence may be determined based on information from the post-encoding processing module 1114. For instance, the ordered sub-channel sequence may be determined based on the rate-matching scheme determined by the post-encoding processing module 1114. Conversely, in some other embodiments, the post-encoding processing module 1114 may determine a rate-matching scheme based on the coding parameters and/or the ordered sub-channel sequence determined by the code processing module 1110. In yet some other embodiments, the determinations made within the code processing module 1110 and post-encoding processing module 1114 are jointly performed and optimized.

The apparatus 1100 could implement any of various other features that are disclosed herein. For example, the asymmetric polar code encoder module 1104, the transmitter module 1106, the code processing module 1110, and/or the post-encoding processing module 1114 could be configured to implement any one or more of the features listed or otherwise described above with reference to FIGS. 9 and 10.

In some alternative embodiments, the functionality of the asymmetric polar code encoder module 1104, the transmitter module 1106, the code processing module 1110, and/or the post-encoding processing module 1114 described herein may be fully or partially implemented in hardware or alternatively in software, for example in modules stored in a memory such as 1112 and executed by one or more processors of the apparatus 1100.

An apparatus could therefore include a processor, and a memory such as 1112, coupled to the processor, storing instructions which, when executed by the processor, cause the processor to perform the functionality and/or embodiments described above in relation to the asymmetric polar code encoder module 1104, the transmitter module 1106, the code processing module 1110, and/or the post-encoding module 1114 described above.

Figure 8:
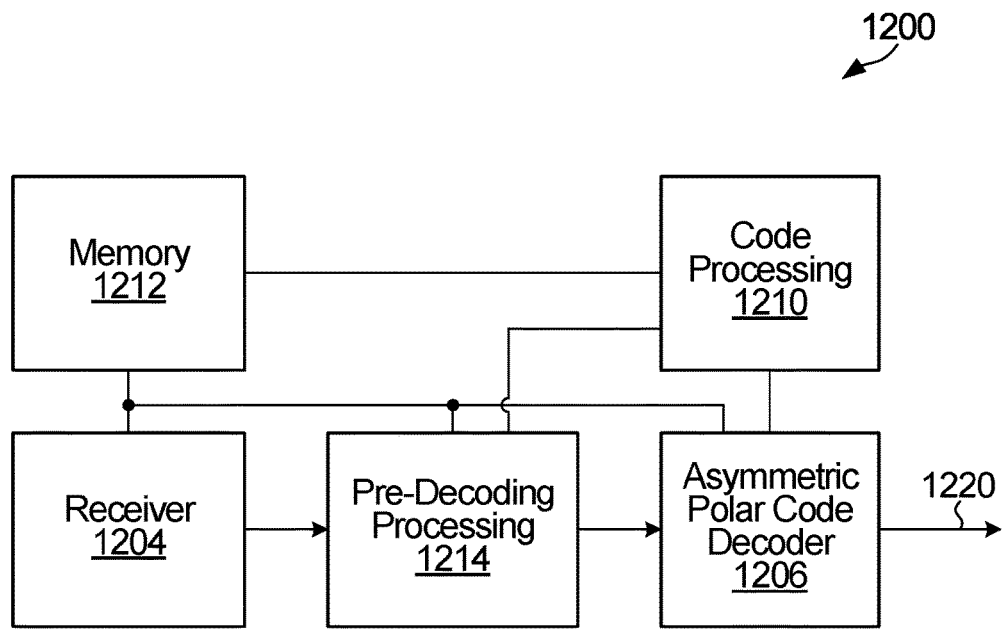
FIG. 8 is a block diagram of an example apparatus for receiving and decoding codewords.

FIG. 8 is a block diagram of an example apparatus for receiving and decoding codewords. The apparatus 1200 includes a receiver module 1204 which is configured to receive signals transmitted wirelessly and which is coupled to an asymmetric polar code decoder module 1206. The apparatus 1200 also includes a code processing module 1210 coupled to the asymmetric polar code decoder module 1206 and a pre-decoding processing module 1214. The pre-decoding processing module 1214 is also coupled to the asymmetric polar code decoder module 1206 and to the receiver module 1204. A memory 1212, also shown in FIG. 8, is coupled to the asymmetric polar code decoder module 1206, to the code processing module 1210, to the receiver module 1204, and to the pre-decoding processing module 1214.

Although not shown, the receiver module 1204 could include an antenna, demodulator, amplifier, and/or other modules or components of a receive chain or alternatively could be configured to interface with a separate (Radio-Frequency—RF) receiving module. For example, some of all of the modules 1204, 1206, 1210, 1212, 1214 of the apparatus 1200 may be implemented in hardware or circuitry (e.g. in one or more chipsets, microprocessors, ASICs, FPGAs, dedicated logic circuitry, or combinations thereof) so as to receive a word based on a codeword of a polar code as described herein. Decoded bits are output at 1220 for further receiver processing.

In some embodiments, the memory 1212 is a non-transitory computer readable medium that includes instructions for execution by a processor to implement and/or control operation of the receiver module 1204, asymmetric polar code decoder module 1206, the code processing module 1210, and the pre-decoding processing module 1214 in FIG. 8, and/or to otherwise control the execution of functionality and/or embodiments described herein. In some embodiments, the processor may be a component of a general-purpose computer hardware platform. In other embodiments, the processor may be a component of a special-purpose hardware platform. For example, the processor may be an embedded processor, and the instructions may be provided as firmware. Some embodiments may be implemented by using hardware only. In some embodiments, the instructions for execution by a processor may be embodied in the form of a software product. The software product may be stored in a non-volatile or non-transitory storage medium, which could be, for example, a CD-ROM, USB flash disk, or a removable hard disk, at 1212.

The asymmetric polar code decoder module 1206 is implemented in circuitry, such as a processor, that is configured to decode received codewords as disclosed herein. In a processor-based implementation of the asymmetric polar code decoder module 1206, processor-executable instructions to configure a processor to perform decoding operations are stored in a non-transitory processor-readable medium. The non-transitory medium could include, in the memory 1212 for example, one or more solid-state memory devices and/or memory devices with movable and possibly removable storage media.

The code processing module 1210 is implemented in circuitry that is configured to determine (and store to the memory 1212) ordered sub-channel sequences as disclosed herein. In a processor-based implementation of the code-processing module 1210, processor-executable instructions to configure a processor to perform code-processing operations are stored in a non-transitory processor-readable medium, examples of which are described above. Information representing ordered sub-channel sequences, and/or the selected sub-channels could be provided to the asymmetric polar code decoder module 1206 by the code processing module 1210 for use in decoding received words, and/or stored in the memory 1212 by the code processing module 1210 for subsequent use by the asymmetric polar code decoder module 1206.

Like the asymmetric polar code decoder module 1206 and the code processing module 1210, the pre-decoding processing module 1214 is implemented in circuitry, such as a processor, that is configured to perform pre-decoding operations. These operations could include receiver/decoder-side rate matching operations also known as de-rate-matching operations, such as de-puncturing and/or de-shortening to reverse puncturing/shortening that was applied at an encoder/transmitter side, for example. In a processor-based implementation of the pre-decoding processing module 1214, processor-executable instructions to configure a processor to perform pre-decoding processing operations are stored in a non-transitory processor-readable medium, examples of which are described above. Information indicative of bit positions and/or sub-channels that are affected by pre-decoding processing, or information from which such bit positions or sub-channels may be determined, may be fed back to the code processing module 1210, stored to the memory 1212, or otherwise made available to the code processing module 1210 by the pre-decoding processing module 1214.

In some embodiments of the code processing module 1210, the ordered sub-channel sequence may be determined based on information from the pre-decoding processing module 1214. For instance, the ordered sub-channel sequence may be determined based on the rate-matching scheme determined by the pre-decoding processing module 1214. Conversely, in some other embodiments, the pre-decoding processing module 1214 may determine a rate-matching scheme based on the coding parameters and/or the ordered sub-channel sequence determined by the code processing module 1210. In yet some other embodiments, the determinations made within the code processing module 1210 and pre-decoding processing module 1214 are jointly performed and optimized.

In some alternative embodiments, the functionality of the receiver module 1204, the asymmetric polar code decoder module 1206, the code processing module 1210, and/or the pre-decoding processing module 1214 described herein may be fully or partially implemented in software or modules, for example in receiving and decoding modules stored in a memory 1212 and executed by one or more processors of the apparatus 1200.

An apparatus could therefore include a processor, and a memory such as 1212, coupled to the processor, storing instructions which, when executed by the processor, cause the processor to perform the functionality and/or embodiments disclosed herein, or receiving/decoding operations corresponding to transmitting/encoding operations disclosed herein.

The apparatus 1200 could implement any of various other features that are disclosed herein. For example, the asymmetric polar code decoder module 1206, the receiver module 1204, the code processing module 1210, and/or the pre-decoding processing module 1214 could be configured to implement any one or more of receiving/decoding features corresponding to encoding/transmitting features noted above.

Where a traditional polar code constructs its generator matrices by connecting two constituent polar codes of equal-sized length with a polarizing transform, the provided asymmetric polar code encoder allows for a polarizing linear block code of any arbitrary length by connecting together constituent polar codes of unequal length. Using constituent codes which are length power of 2, any arbitrary length can be assembled. For example, a desired code length of 6 can be constructed using constituent codes of length 2 and 4.

Referring to FIG. 9, shown is a block diagram of a asymmetric polar code encoder provided by an embodiment of the disclosure.

An input to the asymmetric polar code encoder is a set of bits 50 that has a length $N_A=N_1+N_2$, where $N_A$ is the length of the asymmetric polar code, and $N_1$ is not equal to $N_2$. $N_1$ of the input bits are input to a first polar code encoder 52 which performs polar code encoding to produce an output 54 of length $N_1$. The remaining $N_2$ of the input bits are input to a second polar code encoder 56 which performs polar code encoding to produce an output 58 of length $N_2$. The output 54 of length $N_1$ and $N_1$ bits 60 of the $N_2$ bit output 58 of the second polar code encoder 56 are input to an additional polarizing stage 64 described in further detail below. The output of the additional polarizing stage 64 is an output 54 of length $N_1$. The overall output 68 has a length $N_1+N_2$ and includes the $N_1$ bits 66 output by the additional polarizing stage 64 and the $N_2$ bits output by the second polar code encoder 56.

Where the two polar code encoders in this case are based a polar kernel that is a 2-by-2 matrix, each of $N_1$ and $N_2$ is a power of 2. More generally, each of $N_1$ and $N_2$ is a power of the polar kernel size, which may be 2 or some other value, such as 3 to name a specific example.

The additional polarizing stage 64 is based on the size of the upper of the two polar codes being combined. The structure of the additional polarizing stage is based on the last stage of a polar code encoder one size bigger than that of the upper of the two polar codes being combined. The last stage of a polar code encoder includes the last set of connections and XOR operations.

For an ascending permutation, the size N1 of the upper code will be smaller than the size N2 of the lower code. In this case, additional polarization stage is the same as a last set of connections and XOR operations of a polar code encoder of a size $K^{N1+1}$, where K is the size of the polar code kernel, such that the combined set of bits is based on the N1 polar encoded bits and N1 of the N2 polar encoded bits.

For a descending permutation, the size N1 of the upper code will be greater than the size N2 of the lower code. In this case, the additional polarization stage includes part of a last set of connections and XOR operations of a polar code encoder of a size $K^{N1+1}$, where K is the size of the polar code kernel, such that the combined set of bits includes N2 of the N1 polar encoded bits combined with the N2 polar encoded bits and includes remaining N1-N2 of the N2 polar encoded bits.

More specifically, when joining together an upper stage of size N1 with a lower stage of N2<N1, then the last stage of a polar code of size 2N1 is used to connect them. This indicates that there will be a number of connections in this stage spanning N1 indices, but only the connections for valid indices are used, namely the ones that connect to the smaller lower code of size N2. More generally, an upper code of size N(i+1) is being connected with a with a lower code of size N(i) such that N(i+1)>N(i), then the additional polarization stage will include j connections spanning N(i+1) indices where j=0, 1, . . . , A-1, where N is the length of the entire asymmetric polar code, and A=argmin(N-N(i+1), N(i+1)). In other words, j ranges from 0 to N-N(i+1)-1 in the descending permutation. A similar analysis shows that j ranges from 0 to N(i+1)-1 in the ascending permutation and from Returning to the previously described example where the upper code has N1+1=4 and the lower code has Ni=2, then the additional polarization stage will have j connections which span 4 indices where j=0, 1 since N-N(i+1)-1=6-4-1=1.

Referring now to FIG. 10, shown is a flowchart of a method asymmetric polar coding provided by an embodiment of the invention. The method begins in block 700 with generating (or obtaining) an input bit sequence containing N1+N2 bits, the input bit sequence including information bits and frozen bits, where N1 and N2 are different powers of a polar code kernel size. Block 702 involves polar encoding N1 bits of the input bit sequence with a first constituent polar encoder to produce a set of N1 polar encoded bits. Block 704 involves polar encoding remaining N2 bits of the input bit sequence with a second constituent polar encoder, to produce a set of N2 polar encoded bits. Block 706 involves combining at least some of the N1 polar encoded bits with at least some of the N2 polar encoded bits with a first additional polarizing stage to produce a set of N1 combined bits. Block 708 involves generating an asymmetric polar code codeword of length N1+N2 consisting of the set of N1 combined bits and the N2 polar encoded bits. It is noted that any of the modifications, variations described herein can be applied to the method of FIG. 10.

Figure 11:
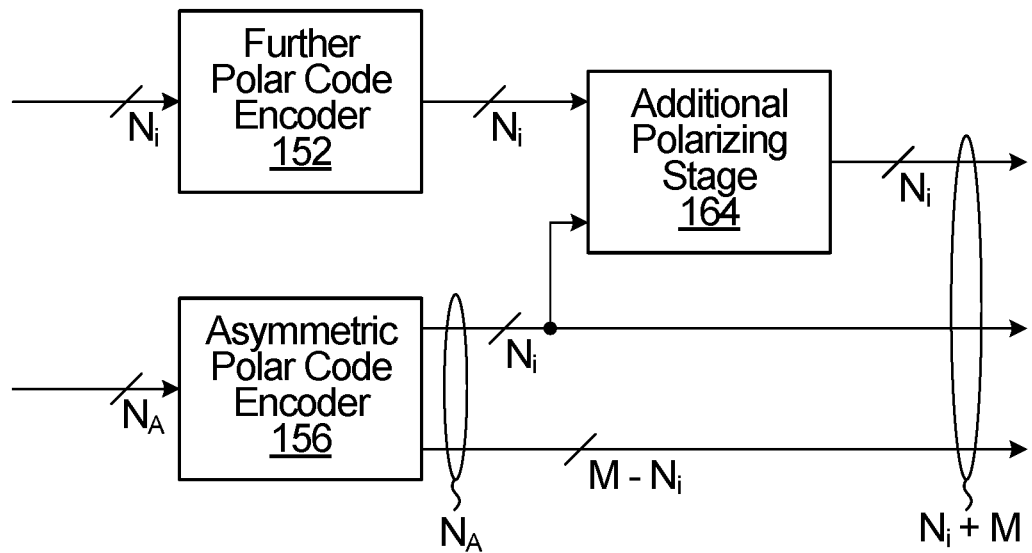
FIG. 11 is a block diagram of an asymmetric polar code encoder provided by an embodiment of the disclosure, in which 3 or more constituent codes are combined.

To produce an asymmetric code based on the combination of 3 (or more) polar codes of different length, the approach of FIG. 9 can be applied in an iterative manner. An asymmetric polar code based on 3 codes includes the encoder of FIG. 9 and a third polar code encoder. The output of the encoder of FIG. 9 and the output of the third polar code are combined using an additional polarizing stage. An example is shown in FIG. 11 which shows combining an asymmetric polar code of length $N_A$ with a polar code of length $N_i$. This approach can be used to combine an arbitrary combination of constituent polar codes in order to produce a polar code of any arbitrary codeword length.

Figure 12:
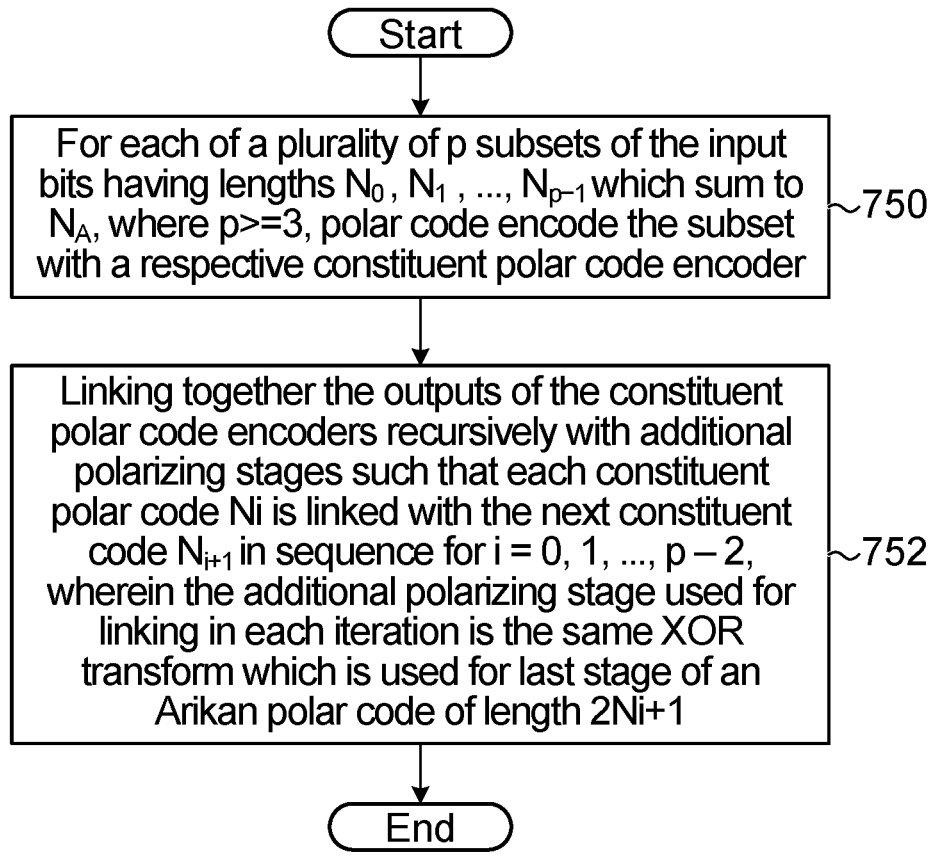
FIG. 12 is a flowchart of a method of asymmetric polar code encoding provided by an embodiment of the disclosure in which 3 or more constituent codes are combined.

FIG. 12 is a flowchart of a method of asymmetric polar coding in which multiple polar codes are combined in an iterative manner. The method involves encoding $N_A$ input bits with a length asymmetric $N_A$ polar code encoder. In block 750, for each of a plurality of p subsets of the input bits having lengths $N_0, N_1, \ldots, N_{p-1}$ which sum to $N_A$, where p>=3, the subset is polar code encoded with a respective constituent polar code encoder. Block 752 involves linking together the outputs of the constituent polar code encoders recursively with additional polarizing stages such that each constituent polar code Ni is linked with the next constituent code $N_{i+1}$ in sequence for i=0, 1, . . . , p−2, wherein the additional polarizing stage used for linking in each iteration is the same XOR transform which is used for last stage of an Arikan polar code of length $2N_{i+1}$; It can be seen that just like a traditional polar code, an asymmetric polar code contains smaller polar codes in their generator matrices and has a recursive structure. Their difference lies in the fact that the asymmetric polar code no longer links two smaller polar codes of the same size. Instead, the asymmetric polar code links together any two polar codes of any length using the same kernel designed for the original scheme. From now on, we will use several examples to explain how asymmetric polar code is constructed. The flowchart of FIG. 12 is particularly applicable to an ascending permutation. If a descending permutation is employed, the alternate form of the additional polarizing stage described herein that is suitable for such a permutation can be employed instead in block 752.

In the examples of FIGS. 9 and 11, the constituent polar codes are ordered in ascending order from the top to the bottom. This is referred to herein as an ascending construction. Reliability of the bits input to the asymmetric polar code encode constructed in this manner generally increases in the same order as the constituent polar codes.

More generally, it is not necessary that the constituent polar codes be ordered in ascending order. The constituent codes can be combined in an arbitrary order.

Figure 13:
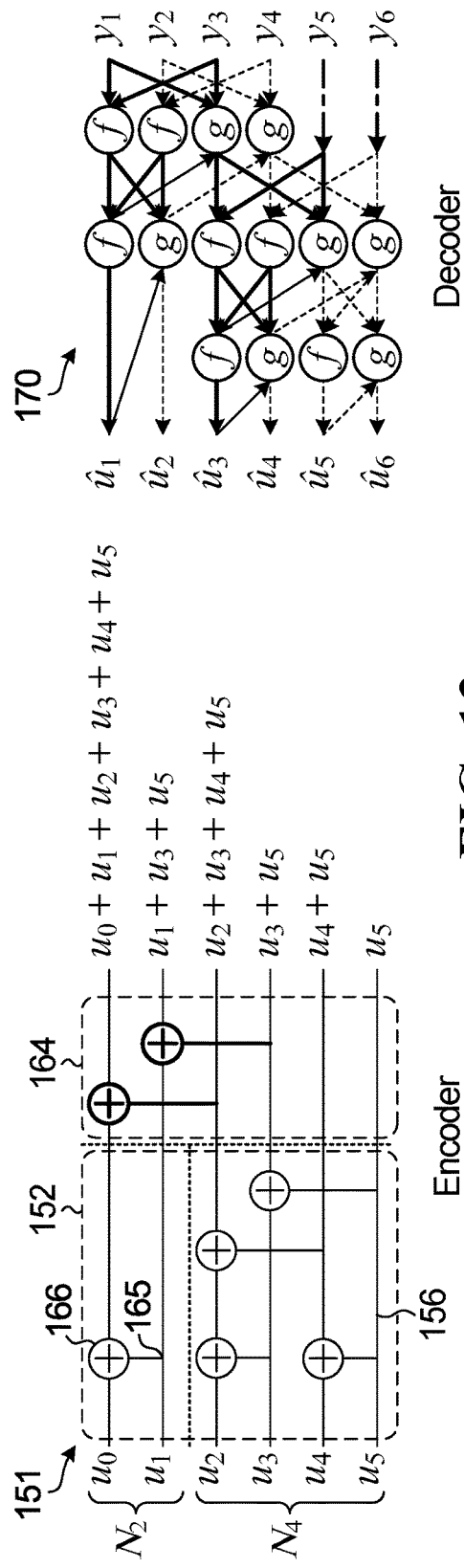
FIG. 13 is an example of an asymmetric polar code linking one 2-by-2 polar code and one 4-by-4 one into one 6-by-6 polar code.

FIG. 13 shows a specific example for $N_A$=6. In this case, the encoder generally indicated at 151 is formed of a first polar code encoder 152 of length 2, and a second polar code encoder 156 of length 4. The outputs of these two polar code encoders are combined using additional polarizing stage 164. It can be seen that this asymmetric polar code has two constituent polar codes of different sizes. Namely, there is a polar code of length 2 (upper code) and a polar code of length 4 (lower code). These two codes are linked by the additional polarizing stage 164 as dictated by the size of the upper code. In this case, the upper polar code is of length 2 so enough connections are required to account for all bits in the upper code. Alternatively, the polar code of length 4 can be the upper code and that of length 2 can be the lower one. Each can generate a respective asymmetric polar code with the same code length (6) but with different performance.

As noted previously, for an ascending permutation, the additional polarizing stage is the last stage of a traditional polar code of a length which is twice as big as the upper code. Specifically, the upper code of length 2 requires the last stage of a polar code of length 4 to be properly linked.

As noted previously, for a descending permutation, the additional polarizing stage is part of the last stage of a traditional polar code of a length which is twice as big as the upper code that is necessary to connect the larger upper code to the smaller lower code. Specifically, the upper code of length 4 requires part of the last stage of a polar code of length 4 to be properly linked to the lower code of length 2.

FIG. 13 shows a specific manner of implementing a polar code based on XOR operations and connection points. An XOR operation represents where two values are combined using XOR. For example, in FIG. 13, the value $u_0$ is input to a first adder 166. A connection point represents where one value is propagated to adder. For example, in FIG. 13, at connection point 168, the value $u_1$ is connected to the input of XOR 166.

Also shown in FIG. 13 is an example decoder generally indicated at 170 which would be implemented in a receiver. The decoder is made up of "f" and "g" functions. This represent the normal calculations of these functions from the original Arikan paper referred to above. The structure of the decoder 170 (and more generally of any decoder) can be deduced from structure of the encoder 151 (and more generally of any polar code encoder) by replacing the XOR operations in the encoder with nodes containing the "f" function, and replacing the connection points within the encoder with nodes containing the "g" function. The inputs of each f or g function are dependent on the size the polar transform in the stage in precisely the same way as with Arikan's SC decoder.

More generally, in the receiver, the successive cancellation (SC) or SC-based (such as list) decoding schedule can be modified accordingly, taking into account the structure of the asymmetric polar code encoder.

As noted above, FIG. 13 shows the asymmetric encoder based on adders and connection points. There are other representations for the same polar code encoder. For example, the code can be represented as a generator matrix. In order to build the generator matrix for the $N_A$=6 polar code, the generator matrices for the constituent codes N=2 and N=4 must be present within it so as to be consistent with the original polar code definition. The generator matrix can be built as a block matrix consisting of the constituent polar code generator matrices and the additional polarizing stages discussed above. The block components as well as the final $G_6$ matrix are explicitly outlined in equations 1 to 4 below. Note that the explicit description of how to link two constituent polar codes with different code lengths can be in different forms: generator matrix-based, graph-based, or formula-based etc.

$$G_2 = \begin{bmatrix} 1 & 0 \\ 1 & 1 \end{bmatrix} G_4 = \begin{bmatrix} 1 & 0 & 0 & 0 \\ 1 & 1 & 0 & 0 \\ 1 & 0 & 1 & 0 \\ 1 & 1 & 1 & 1 \end{bmatrix} G_2 \otimes \hat{1}_4 = G_2 \otimes \hat{1}_2 = \begin{bmatrix} 1 & 0 \\ 1 & 1 \\ 1 & 0 \\ 1 & 1 \end{bmatrix} \quad (1)$$

$$G_2 \otimes \hat{0}_4 = \quad (2)$$

$$G_2 \otimes \hat{0}_2 = \begin{bmatrix} 0 & 0 & 0 & 0 \\ 0 & 0 & 0 & 0 \end{bmatrix} G_6 = \begin{bmatrix} 1 & 0 & 0 & 0 & 0 & 0 \\ 1 & 1 & 0 & 0 & 0 & 0 \\ 1 & 0 & 1 & 0 & 0 & 0 \\ 1 & 1 & 1 & 1 & 0 & 0 \\ 1 & 0 & 1 & 0 & 1 & 0 \\ 1 & 1 & 1 & 1 & 1 & 1 \end{bmatrix}$$

$$\hat{1}_l = \begin{bmatrix} 1_0 \\ 1_1 \\ \vdots \\ 1_{l-1} \end{bmatrix} \hat{0}_l = \begin{bmatrix} 0_0 & 0_1 & \cdots & 0_{l-1} \end{bmatrix} G_2 = \begin{bmatrix} 1 & 0 \\ 1 & 1 \end{bmatrix} \quad (3)$$

-continued $$G_2^{\otimes k} = G_2^{\otimes k-1} \otimes G_2 \quad (4)$$

$$G_2^{\otimes 1} = \begin{bmatrix} 1 & 0 \\ 1 & 1 \end{bmatrix}$$

$$G_2^{\otimes 1} = G_2^{\otimes 0} \otimes G_2$$

$$G_2^{\otimes 1} = [1] \otimes \begin{bmatrix} 1 & 0 \\ 1 & 1 \end{bmatrix}$$

$$\therefore G^{\otimes 0} \triangleq [1] = G_1$$

For a more general description, the full definition of the generator matrix construction in the example is given in equation 5 as shown in FIG. 25 for an asymmetric code of length $N_A$. Recall that Arikan polar code generator matrices are defined to be $G_N = G_2 \otimes^{log2N}$ where the "0" operator refers to the Kronecker product of matrices. in other words, the G2 matrix undergoes $log_2 N$ Kronecker product operations with itself to get $G_N$.

Figure 14:
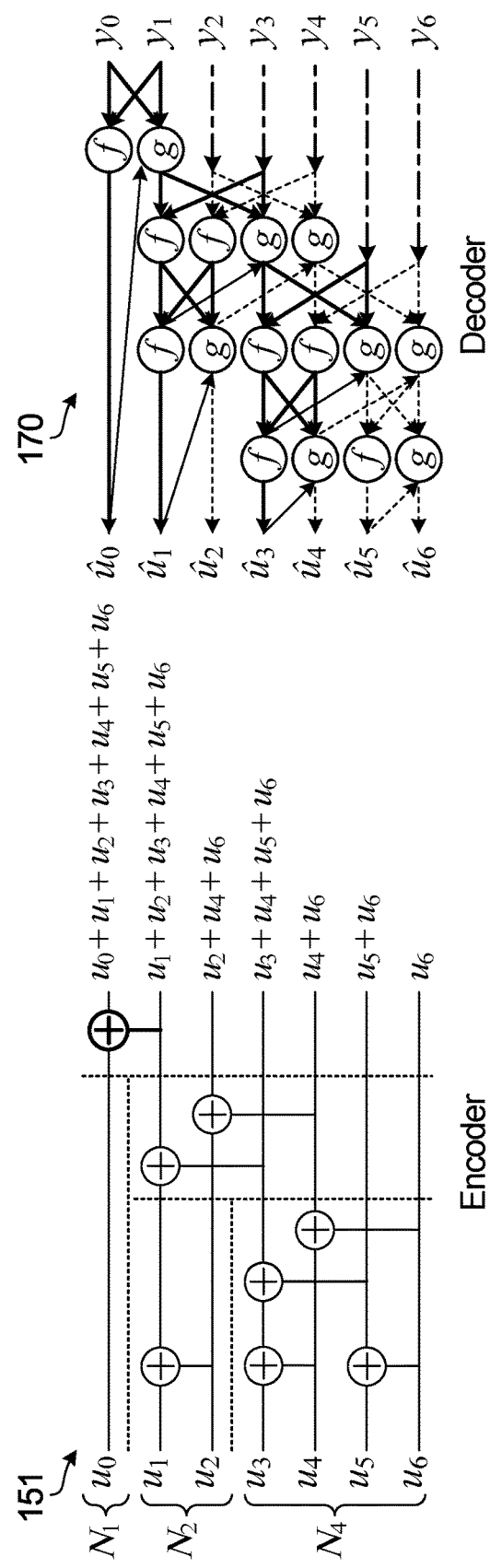
FIG. 14 is an example of an asymmetric polar code linking one 1-by-1 polar code, one 2-by-2 polar code and one 4-by-4 one into one 7-by-7 polar code.

FIG. 14 depicts another example of the asymmetric polar code scheme for $N_A=7$: In order to make up a polar code of code-word length 7, there must be constituent codes of lengths 4, 2, and 1. The matrix G7 is found in equation 6 below. A polar code of length 1 is defined to be a single uncoded bit in equation 4.

$$G_u = \begin{bmatrix} 1 & 0 & 0 & 0 & 0 & 0 & 0 & 0 & 0 & 0 & 0 & 0 & 0 & 0 \\ 1 & 1 & 0 & 0 & 0 & 0 & 0 & 0 & 0 & 0 & 0 & 0 & 0 & 0 \\ 1 & 0 & 1 & 0 & 0 & 0 & 0 & 0 & 0 & 0 & 0 & 0 & 0 & 0 \\ 1 & 1 & 1 & 1 & 0 & 0 & 0 & 0 & 0 & 0 & 0 & 0 & 0 & 0 \\ 1 & 0 & 1 & 0 & 1 & 0 & 0 & 0 & 0 & 0 & 0 & 0 & 0 & 0 \\ 1 & 1 & 1 & 1 & 1 & 1 & 0 & 0 & 0 & 0 & 0 & 0 & 0 & 0 \\ 1 & 0 & 1 & 0 & 0 & 0 & 1 & 0 & 0 & 0 & 0 & 0 & 0 & 0 \\ 1 & 1 & 1 & 1 & 0 & 0 & 1 & 1 & 0 & 0 & 0 & 0 & 0 & 0 \\ 1 & 0 & 1 & 0 & 1 & 0 & 1 & 0 & 1 & 0 & 0 & 0 & 0 & 0 \\ 1 & 1 & 1 & 1 & 1 & 1 & 1 & 1 & 1 & 0 & 0 & 0 & 0 \\ 1 & 0 & 1 & 0 & 0 & 0 & 1 & 0 & 0 & 0 & 1 & 0 & 0 & 0 \\ 1 & 1 & 1 & 1 & 0 & 0 & 1 & 1 & 0 & 0 & 1 & 1 & 0 & 0 \\ 1 & 0 & 1 & 0 & 1 & 0 & 1 & 0 & 1 & 0 & 1 & 0 & 1 & 0 \\ 1 & 1 & 1 & 1 & 1 & 1 & 1 & 1 & 1 & 1 & 1 & 1 & 1 & 1 \end{bmatrix} \quad (7)$$

$$G_7 = \begin{bmatrix} 1 & 0 & 0 & 0 & 0 & 0 & 0 \\ 1 & 1 & 0 & 0 & 0 & 0 & 0 \\ 1 & 1 & 1 & 0 & 0 & 0 & 0 \\ 1 & 1 & 0 & 1 & 0 & 0 & 0 \\ 1 & 1 & 1 & 1 & 1 & 0 & 0 \\ 1 & 1 & 0 & 1 & 0 & 1 & 0 \\ 1 & 1 & 1 & 1 & 1 & 1 & 1 \end{bmatrix} \quad G_8 = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix} \quad (6)$$

Asymmetric polar code encoder is a novel polar coding encoder that can achieve any arbitrary codeword length $N_A$ with a granularity of 1 bit. The proposed scheme involves linking of constituent Arikan polar codes, which are referred to as constituent polar codes. An asymmetric polar code is comprised of p constituent polar codes whose lengths comprise the set N. For a code length of $N_A$, the vector $N=\{N_0, N_1, \ldots, N_{p-1}\}$ is populated with all the constituent polar code lengths which sum to $N_A$. The minimum required constituent polar code lengths are determined by converting the desired asymmetric code length to a binary value bin $(N_A)$, then for each 1 inserting the corresponding binary index value into N. For example, a code length of $N_A=14$ converts to $bin(N_A)=1110_2$, and therefore $N=\{8, 4, 2\}$ and $p=3$. The constituent polar codes are linked together with a polarizing transform. The linking process is executed recursively whereby each constituent code $N_i$ is linked with the next constituent code $N_{i+1}$ in sequence for $i=0, 1, \ldots, p-2$. As such, producing the generator matrix for asymmetric polar codes requires p-1 iterations of this process. The polarizing transform used for linking in each iteration is the same XOR transform which is used for last stage of an Arikan polar code of length $2N_{i+1}$. This recursive algorithm is outlined by equation 5.

For example an asymmetric polar code of length seven has minimum required partial codes $N=\{4, 2, 1\}=\{N_0, N_1, N_2\}$ (in this order for ascending permutation) and $p=3$ and so there should be $p-1=2$ linking iterations. The first iteration is to connect 4 and 2, and so $i=0$, and the polarizing stage used to link them is the last stage of a polar code of length $2*N_{i+1}=2*N_{0+1}=2*N_1=2*2=4$. For the second and final iteration, $i=1$, and so we are linking the code of size $N_{i+1}=N_2=1$ with the previously linked stages in the same manner. We then need a final polarizing stage equal to the last stage of a polar code of size $2*N_{i+1}=2*N_{1+1}=2*N_2=2*1=2$.

Figure 15A:
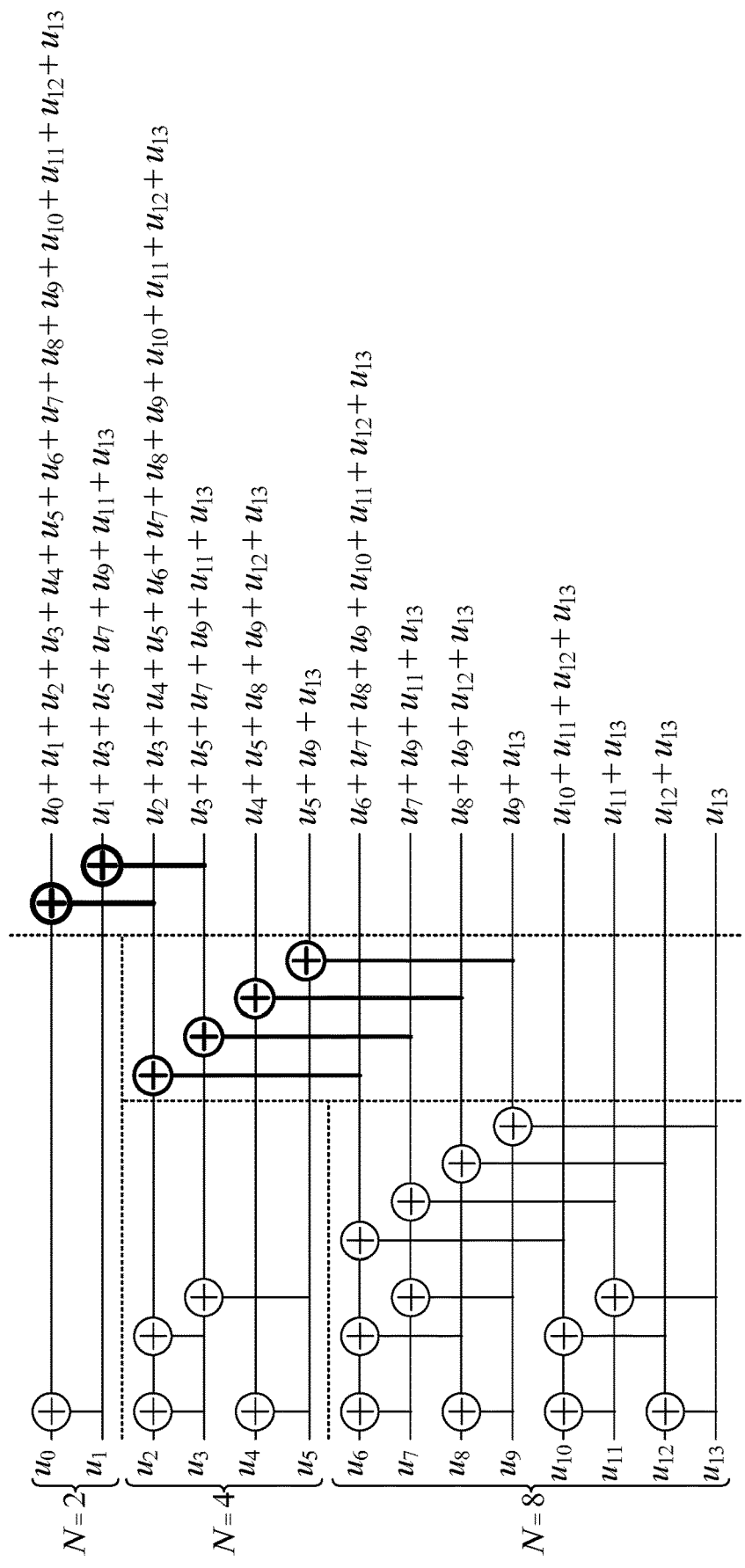
FIG. 15A is an example of an asymmetric polar code linking one 2-by-2 polar code, one 4-by-4 polar code and one 8-by-8 one into one 14-by-14 polar code.
Figure 15B:
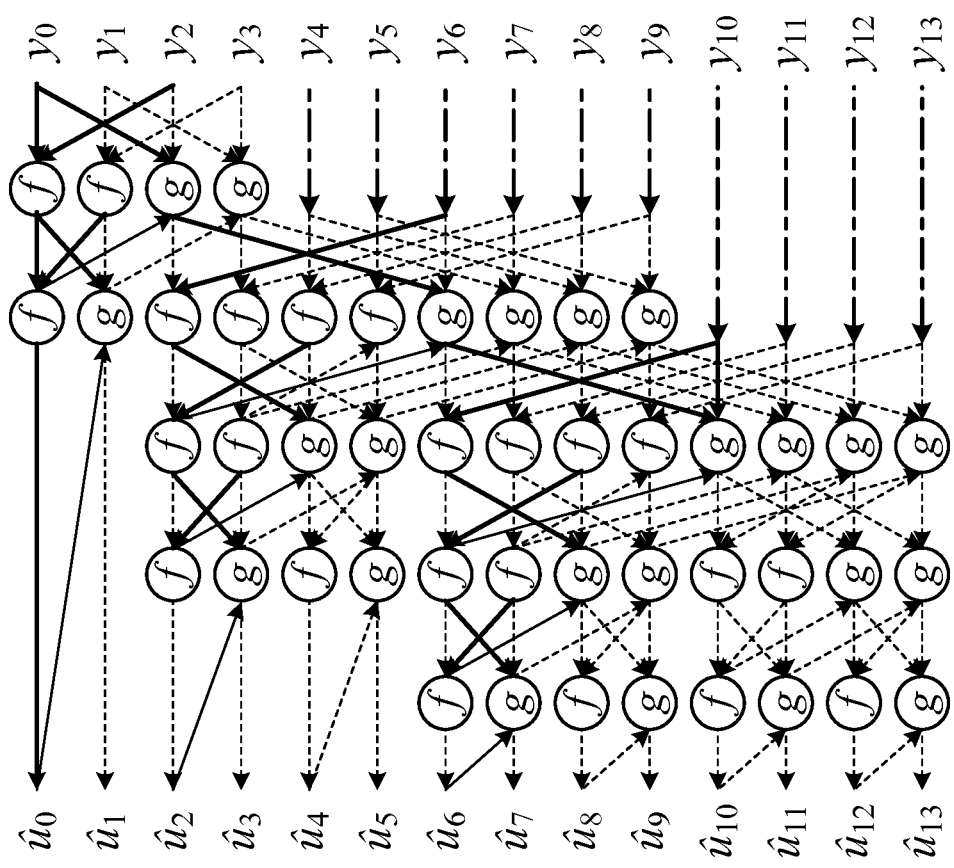
FIG. 15B is an example of a corresponding decoder.

The generator matrix $G_{14}$ for the $N_A=14$ can be found in equation 7. The corresponding encoder and decoder are shown in FIGS. 15A and 15B.

This representation is a valid for linking together any set of polar codes that are ordered according to size in an ascending manner.

Some of the examples and embodiments described above assume that the constituent polar codes are ordered in ascending size from least to most reliable and have been referred to as an "ascending" permutation. In other embodiments, the constituent polar codes are ordered from largest to smallest from least to most reliable, and this is referred to as a "descending permutation". More generally, still, in some embodiments, the constituent codes can be used in any order to constitute an asymmetric code.

Frozen or Information Bit Positions in Asymmetric Polar Code

To determine frozen or information bit positions in an asymmetric polar code, the same frozen set construction algorithms used to build reliability sets for Arikan polar codes can be re-used for asymmetric polar codes as well. Both Bhattacharyya parameter expansion and Gaussian approximation serve as effective methods for building frozen sets. However, the asymmetry of the Tanner graphs of asymmetric polar codes should be considered in order to carry out the algorithms accurately. The original method for Bhattacharyya parameter expansion consists of recursively duplicating the Bhattacharyya parameter of the uncoded channel in a tree-like structure according to equation 8, where z old is the Bhattacharyya parameter of one index of the previous stage of the Tanner graph and are two new parameters at two indices of the next stage. This process is carried out $log_2 N$ times. These equations are valid because each stage of an Arikan polar code receives LLRs for each bit index which have been transformed an equal number of times due to the symmetry of polar codes. However, asymmetric codes must account for the possibility that some bit indices in each stage may receive LLRs which have been transformed an unequal number of times, as seen in equation 9.

$$z_{0,new}=(z_{0,old}+z_{1,old})-z_{0,old}z_{1,old}z_{1,new}=z_{0,old}z_{1,old} \quad (9)$$

Figure 16:
FIG. 16 depicts an example of how to adjust parameters of a Tanner graph to account for LLRs being transformed an unequal number of times.

Here, $z_{0,old}$, $z_{1,old}$ are two parameters at two separate indices of the previous stage of the Tanner graph, and and $z_{0,new}$, $z_{1,new}$ are two new parameters at two indices of the next stage. A visualization of this transformation can be seen in FIG. 16.

The Gaussian approximation expansion equations can be adjusted to accommodate the asymmetry in a similar fashion. A construction example for an $N_A=7$ code using Battacharyya parameter expansion for a BEC channel with E=0.5 can be seen below. The resulting bit reliability order from this construction from most to least reliable is {6, 5, 4, 2, 0, 3, 1}. This is the reliability ordering for the 7 bits of an asymmetric polar code of size 7. This can be used to choose a frozen set by selecting the K most reliable indices (from left to right in this case), just as with any other type of polar code.

Because one asymmetric polar code consists of more than one traditional constituent polar codes with different lengths, its reliability set or reliability sequence can be a combination of the reliability sets of the constituent polar codes. In another words, the asymmetric polar code constructor can obtain its reliability sequence from those of the constituent polar codes. The combination scheme is related to how the constituent polar codes are linked. For example in FIG. 13, the case where the N=2 constituent polar code is the upper code would have a different combination scheme from the case where the N=4 constituent polar code is the upper code, even though they end up with the same $N_A=6$ code length. However, both cases would have different reliability sequences for $N_A=6$. Therefore, the reliability sequence can be realized in one of two ways:

1) define one or more long asymmetric reliability sequences from which shorter sequences are generated in a nested way. A long sequence can be defined from several shorter sequences, which are in turn defined from the even shorter ones. In the end, the shortest ones can be determined from a large number of the simulations and stored in a lookup table.

2) define short reliability sequences from which longer sequences are dynamically built in terms of the combination or linkage methods of an asymmetric polar code.

Furthermore, the combination scheme and the polarization (reliability) of each constituent polar code affects how the information bits are allocated among the constituent polar codes (implicitly, the information bit allocation equals to the coding rate allocation or coding capacity allocation). For the example in FIG. 13, the constituent N=2 polar code has less polarization than that N=4 polar code, and N=2 polar code is placed in the upper part. Both determine that the overall reliability of the N=2 polar code is lower than that of N=4 polar code in this $N_A=6$ case. In a specific example, if 4 information bits are encoded (4/6 coding rate), three of them may be placed on the N=4 polar code and one of them may be placed on the N=2 polar code. In another words, the total coding rate 4/6 is allocated into 1/6 on the N=2 polar code and 3/6 on the N=4 polar code. The allocation can be recursive. More specifically, where there are 4 information bits to encode into 6 codeword bits, the 4 positions for the information bits should be the most reliable 4 bit positions to have the best decoding performance. The total encoding generator matrix consists of two asymmetric codes, 2-by-2 and 4-by-4. The overall reliability on the 2-by-2 is lower than the overall one of 4-by-4, because polarization generally increases with length. Then, it may be the case that the more reliable bit position of the 2-by-2 is barely more reliable than the least reliable bit positions of the 4-by-4. In this case, if we have 4 information bits to encode, we may place 1 information bit on the 2-by-2 constituent polar code, and place 3 information bits on 4-by-4 constituent polar code. These constructions above can be realized by some pre-defined tables in terms of information bit size, codeword, or coding rate. Alternatively, a formula-based method can be used to determine the frozen and information bit positions.

Asymmetric Polar Code-Based HARQ Transmission

In another embodiment, Asymmetric polar codes are used to support a finer retransmission or hybrid automatic repeat request (HARQ). This will be introduced first by way of example.

Consider an application where there is a need to encode 3 bits $b_1$, $b_2$, and $b_3$. An initial transmission can be made based on encoding these 3 bits using a traditional N=4 polar code. An example is shown in FIG. 17A generally indicated at 350. A receiver may not succeed in decoding the initial transmission, and may transmit feedback, for example in the form of an acknowledgement (ACK)/negative ACK (NACK) or a channel quality indicator to the transmitter.

Based on the feedback, the transmitter encodes an asymmetric codeword with length $N_A=6$, for example as shown in the example in FIG. 13. One of the three bits (for example, the information bit taking the least reliable bit position in the initial transmission) is placed in the information bit position of the N=2 constituent polar code (i.e. one of the first two bit positions of the $N_A=6$ polar code). In preparing the second transmission (first retransmission), the transmitter encodes the $N_A=6$ asymmetric polar code, but only transmits the first two coded bits as incremental redundancy. At the receiver side, the two coded bits of the second transmission (new new) would be combined or juxtaposed with the 4 coded bits of the initial codeword (old old old old) to form a $N_A=6$ codeword (new new old old old old) for processing using an $N_A=6$ asymmetric polar decoder. Because one of the information bit is re-transmitted, the asymmetric polar decoder on the second transmission can treat the re-transmitted information bit as a normal information bit and the original one as its parity check bit. In some embodiments, an SC-based list decoder uses this parity-check bit to select the list paths. Using this approach, compared with traditional polar code, an asymmetric polar code can be used to realize a more flexible incremental redundancy.

In the first transmission, [0, b1, b2, b3] are encoded onto N=4 polar code to have [$x_{1,1}$, $x_{1,2}$, $x_{1,3}$, $x_{1,4}$]. A receiver can independently decode [$LLR_{1,1}$, $LLR_{1,2}$, $LLR_{1,3}$, $LLR_{1,4}$] by a N=4 polar decoder if channel condition is good enough.

In the second transmission, [0, b1, 0, b1, b2, b3] are encoded onto $N_A=6$ polar code to have [$x_{2,1}$, $x_{2,2}$, $x_{2,3}$, $x_{2,4}$, $x_{2,5}$, $x_{2,6}$] as IR-HARQ, only [$x_{2,1}$, $x_{2,2}$]. A receiver can combine two received LLRs as: [$LLR_{2,1}$, $LLR_{2,2}$, $LLR_{1,1}$, $LLR_{1,2}$, $LLR_{1,3}$, $LLR_{1,4}$] them by a $N_A=6$ polar decoder if channel condition is good enough.

Figure 17B:
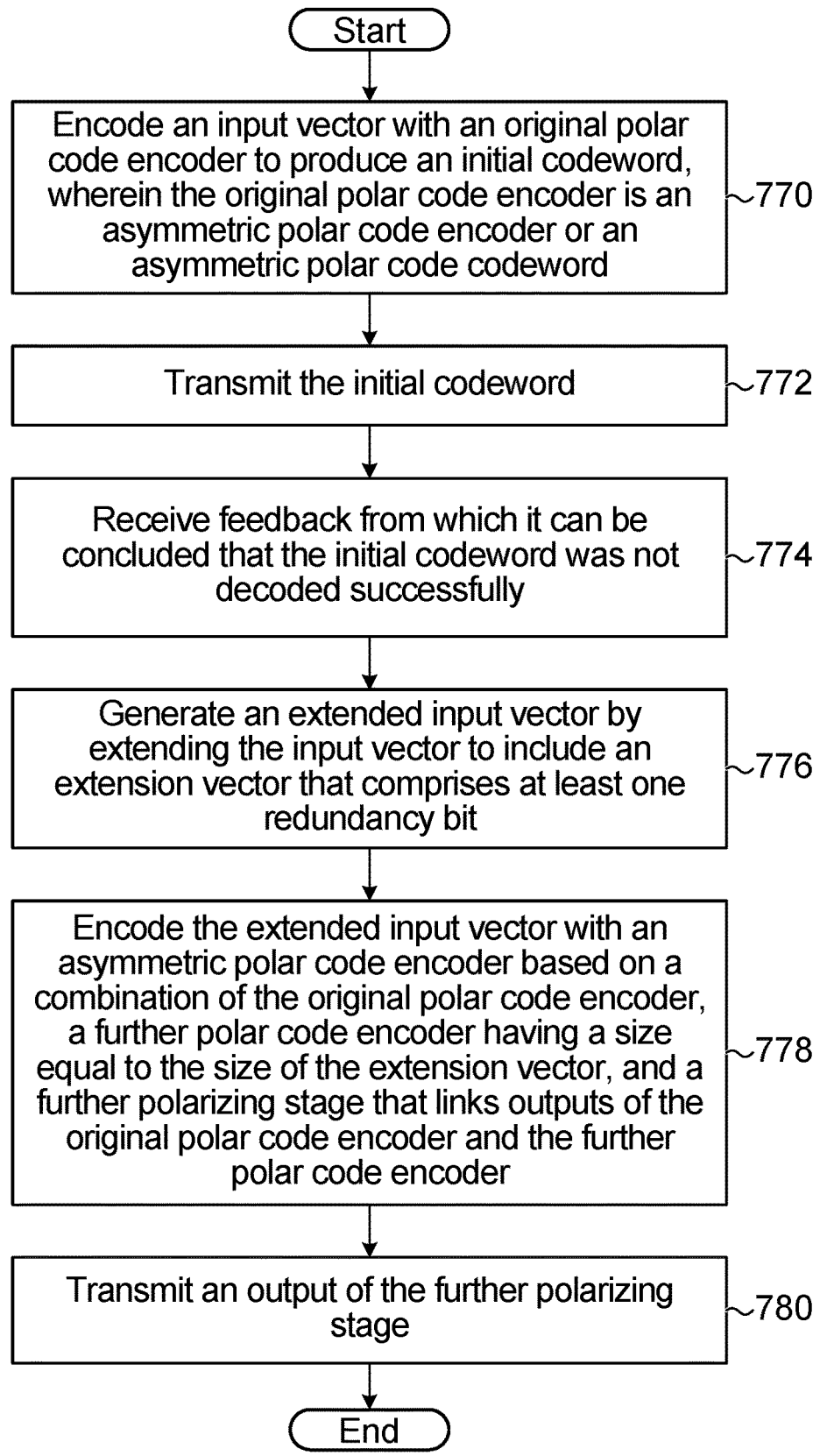
FIG. 17B is a flowchart of a method of using an asymmetric polar code for HARQ incremental redundancy.
Figure 19:
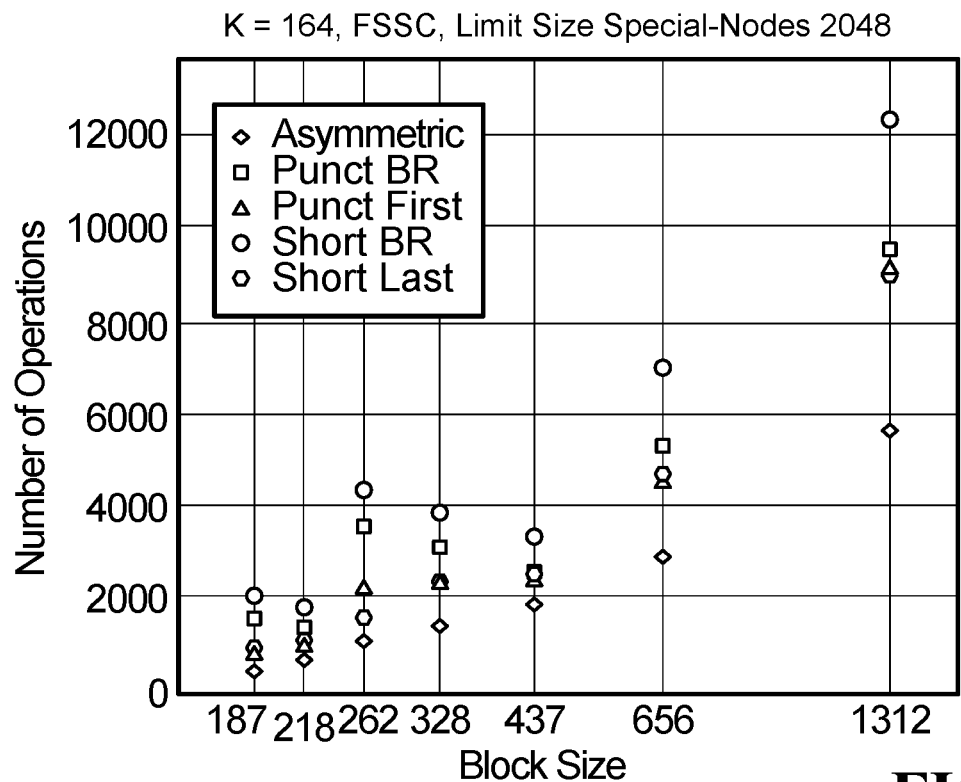
FIGS. 19 to 22 show various simulation results for asymmetric polar codes.
Figure 20:
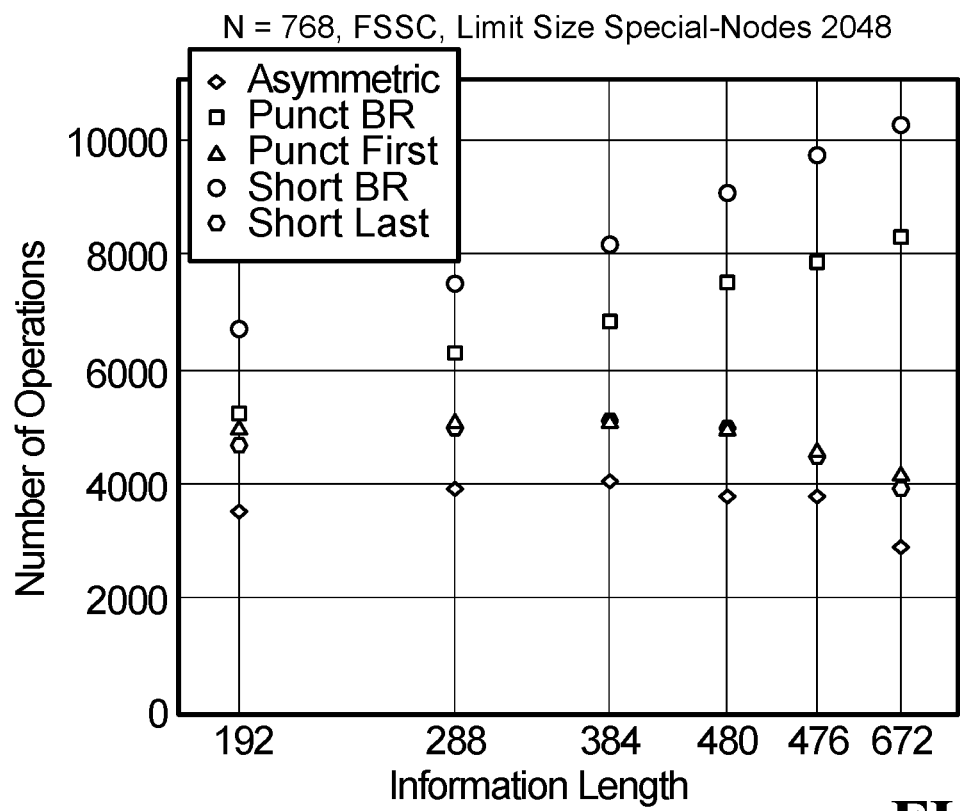

FIG. 17B is a flowchart of a method of using asymmetric polar codes to support a finer retransmission or hybrid automatic repeat request (HARQ). The method begins in block 770 with encoding an input vector with an original polar code encoder to produce an initial codeword, wherein the original polar code encoder is an asymmetric polar code encoder for an asymmetric polar code codeword. Block 772 involves transmitting the initial codeword. Block 774 involves receiving feedback from which it can be concluded that the initial codeword was not decoded successfully. Block 776 involves generating an extended input vector by extending the input vector to include an extension vector that comprises at least one redundancy bit. Block 778 involves encoding the extended input vector with an asymmetric polar code encoder based on a combination of the original polar code encoder, a further polar code encoder having a size equal to the size of the extension vector, and a further polarizing stage that links outputs of the original polar code encoder and the further polar code encoder. Block 780 involves transmitting an output of the further polarizing stage.

For decoding, the same operations can be used for decoding asymmetric polar codes as when decoding Ankan polar codes. All standard decoders used for Ankan codes (ie. SC, SC List, SC List CRC, SC Stack, SC Flip, etc.) can be used with only a change in schedule. Additionally, Fast-simplified successive cancellation (SSC) decoding schedules can be easily compiled for asymmetric polar codes since the same types of simplified nodes (i.e. Rate-0, Rate-1, single parity check (SPC), repetition (REP), etc.) can be applied to the asymmetric SC tree as with a typical SC tree.

By way of example, the SC tree for an asymmetric code N=14 is shown in FIG. 18 generally indicated at 450, along with its Fast-SSC counterpart generally indicated at 450.

Technical Benefits of Asymmetric Polar Codes

A technical benefit of asymmetric polar code is that fewer decoding operations are required than would be required to decode a conventional polar code that has been punctured or shortened to the same length as the asymmetric polar code. For example, to produce a length 6 code using the state of the art method involves using a puncturing/shortening scheme. This involves construction of a code of length 8 and optimizing a puncturing/shortening set of size 2. The decoder for this approach is the decoder for an Arikan polar code of length 8, which requires $N \cdot \log_2 N = 8 \log_2 8$ decoding operations, namely 24 steps. With an asymmetric codes, $N \cdot \log_2 N$ steps for each constituent code plus $2 \cdot N$ steps for each additional polarizing stage are required. For a code of length 6, only $4 \times \log_2 4 + 2 \times \log_2 2 + 2 \times (2) = 14$ steps are required.

An asymmetric polar code decoder requires a fewer number of computations than a punctured or shortened polar code of the same length. This is because most shortened and punctured codeword lengths are considerably smaller than their respective mother code length. Puncturing and shortening scheme are less efficient usage of memory and processor resources since they must decode their mother code in order to receive an effectively smaller codeword. In contrast, an asymmetric polar code does not have this issue and only carries out decoding operations needed for an exact codeword length. The number of decoding computations for punctured and shortened codes can be computed with the formula $N_M \cdot \log_2 N_M$, which scales only with the length of the mother code. The formula describing the number of computations required by an asymmetric decoder is $\leq \Sigma_{i=0}^{P-1} N_i \cdot \log_2 N_i + \Sigma_{i=1}^{P-1} 2 \cdot N_i$.

An asymmetric polar code decoder also requires a fewer number of computations than multi-kernel polar codes. The formula describing multi-kernel code complexity is $N_{MK}(n+m)$. However, while the three multi-kernel (MK) decoding LLR functions can be computed using the F and G functions, those computations require 2 steps each. Specifically, $\lambda 0$ is equal to 2 Fs, $\lambda 1$ is equal to 1 F and 1 G, and $\lambda 2$ is equal to 2 Gs and an additional XOR. Further, the complexity equation is then $N_{MK}(n+2^*m)$ when using the same Arikan SC decoder used for asymmetric polar codes of any length. Thus, the complexity of decoding a multi-kernel polar code is always a higher number of decoding computations than an equivalent asymmetric polar code. For example, N=6 requires 14 steps for asymmetric polar code, but a multi-kernel code requires 18.

Another important benefit of asymmetric polar codes, over multi-kernel codes, is that asymmetric polar codes can potentially run on existing polar decoding hardware. In comparison to a conventional polar code decoder, an asymmetric polar code decoder only needs to modify the decoding schedule of the conventional polar decoder hardware. This is not true for multi-kernel codes, which require dedicated hardware.

Simulation Results

Figure 23:
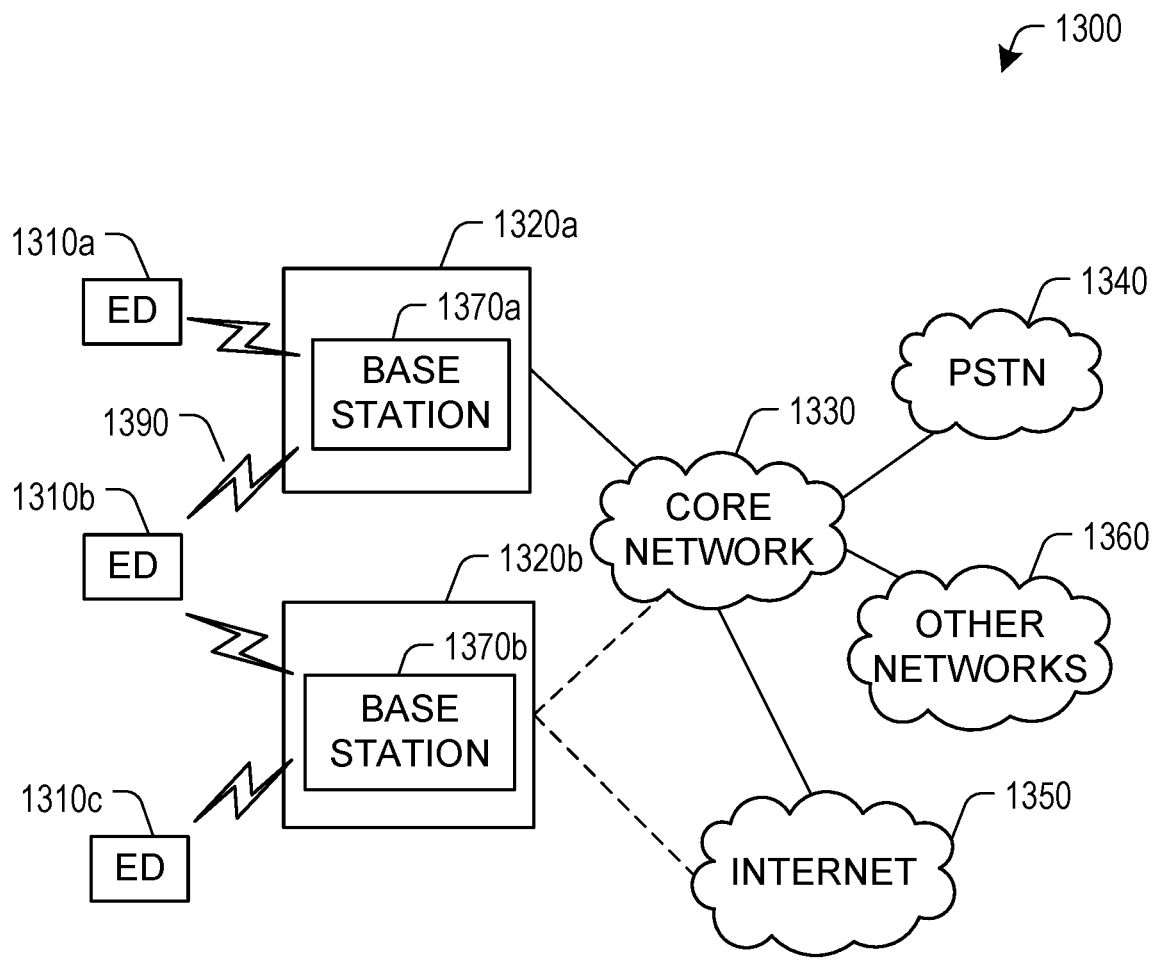
FIG. 23 is a block diagram of an example communication system in which embodiments disclosed herein may be used.

Regarding Fast-SSC, one might expect that punctured or shortened polar codes might have faster decoding time than an asymmetric polar code of equivalent length due to the fact that punctured and shortened codes are ostensibly decoding their mother codes with a high proportion of frozen bits and thus leading to a higher number of Rate-0 or SPC nodes. However, simulations confirm that this is generally not true. FIGS. 23 and 24 are plots which outline a comparison of the number of decoding steps required for asymmetric polar codes vs. punctured/shortened polar codes of equal length under Fast-SSC decoding. In these plots, "Punct" indicates punctured polar codes, while "Short" indicates shortened polar codes. "BR" indicates shortening/puncturing the last/first $N_m - N$ bits using bit reversed indices, while "F" and "L" indicate puncturing the first/last $N_M - N$ bits with non-bit reversed indices. While the actual puncturing and shortening methods are not important for an appreciation of this graph, it should be understood that the resulting frozen set pattern has an impact on the latency of Fast-SSC decoding. For FIG. 23, the message length is held constant at 164 and sweeps code lengths from N=187 to N=1312. Essentially, this is a sweep of code rates with a constant message size. What the graph shows is that even under Fast-SSC decoding, asymmetric polar codes have the fewest decoding operations of all length-compatible polar coding methods which can be decoded with Fast-SSC. FIG. 24 depicts results for the case where code rate is swept with a constant code length N=768 rather than constant message size, and again, the results show superior performance for the asymmetric polar codes.

Asymmetric Fast-SSC decoding still requires fewer computations than Fast-SSC decoding of punctured/shortened codes of the same length. The Fast-SSC computation complexity of a variety of puncturing and shortening schemes was investigated. It is worth mentioning that asymmetric decoders will often have smaller Fast-SSC node sizes than those of punctured/shortened Fast-SSC decoders for equal code lengths. For example, a punctured or shortened code of length N=1312 has a maximum node size of 1024, while an asymmetric code of that same length has a maximum node size of 512. It should also be noted that the generally closest competitor of asymmetric codes at this time in terms of FER performance is shortened polar codes using the bit reversal technique, which have the worst Fast-SSC speedup of all codes that were investigated.

From the simulations, asymmetric polar codes have very good performance. When using a list decoder with a CRC-aided path selector, asymmetric codes have comparable performance to the leading low-complexity puncturing and shortening schemes when using medium to high code rates. When using low rates, asymmetric codes outperform both punctured and shortened polar codes.

Figure 21:
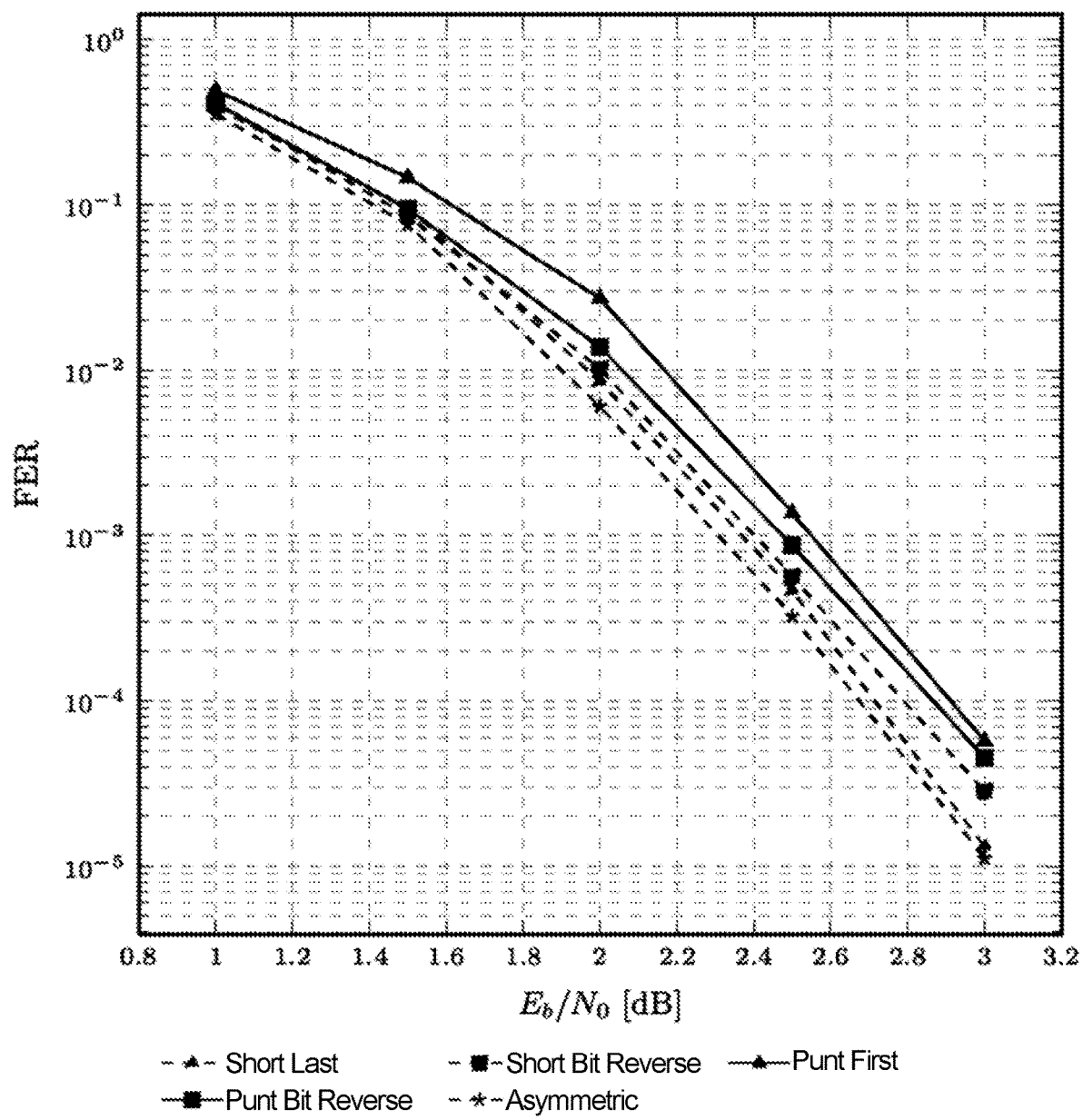
Figure 22:
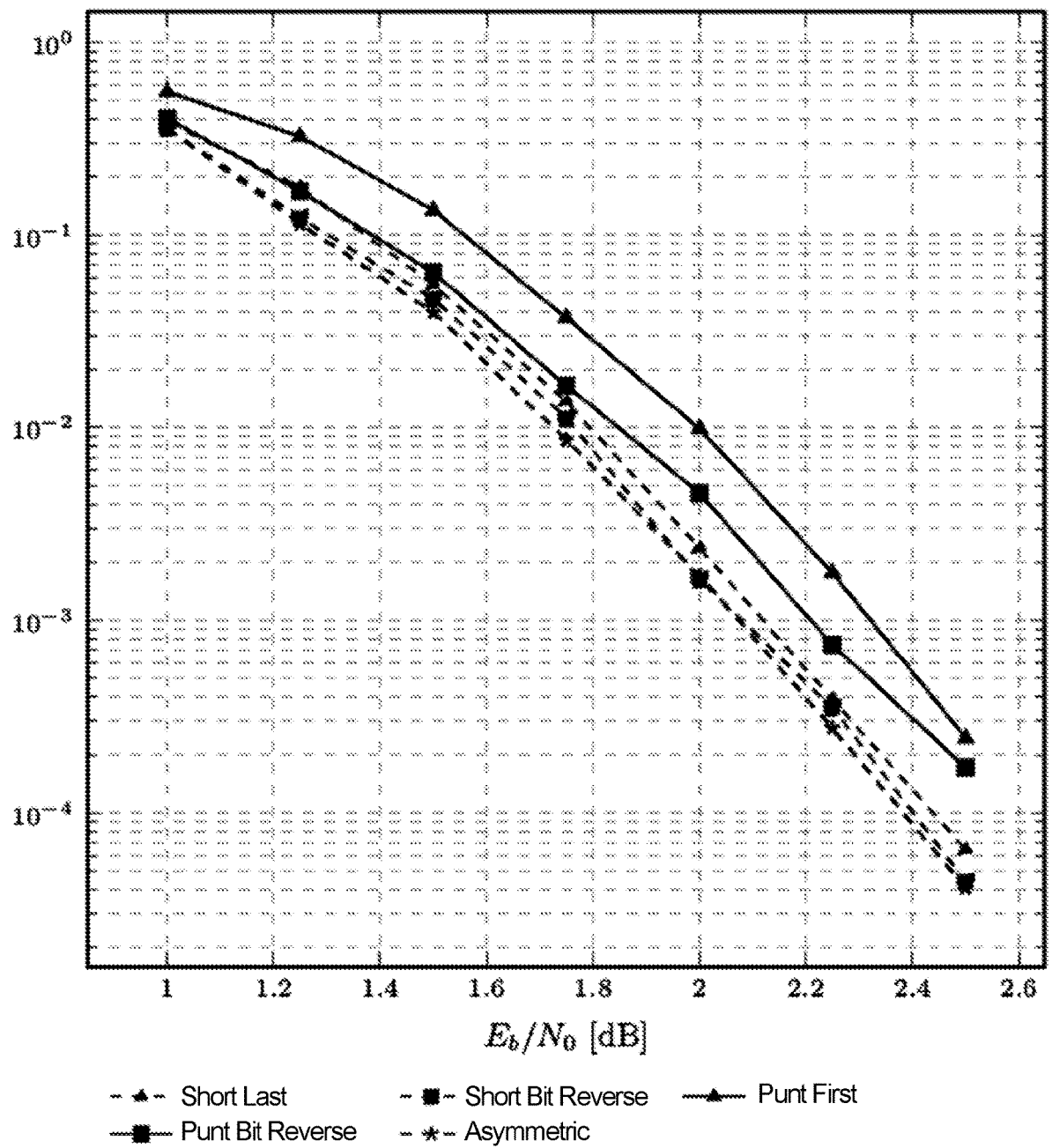

FIGS. 21 and 22 show simulations of polar codes PC(768, 384) and PC(1536, 768) comparing asymmetric codes with low complexity puncturing and shortening schemes. Just as with traditional polar codes, asymmetric codes generally improve in performance as their length increases. However, it should be noted that asymmetric codes with constituent code sets N tend to have better performance. In other words, the fewer asymmetric linkages in the code, the better. Asymmetric codes have poor performance at lengths that are slightly less than powers of two when compared with equivalent punctured or shortened codes. This is because those lengths have large asymmetric code sets and puncturing/shortening schemes are only compromising a small number of bits to attain their reduced length.

FIG. 23 illustrates an example communication system 1300 in which embodiments of the present disclosure could be implemented. In general, the communication system 100 enables multiple wireless or wired elements to communicate data, and other content. The purpose of the communication system 1300 may be to provide content (voice, data, video, text) via broadcast, narrowcast, user device to user device, etc. The communication system 1300 may operate by sharing resources such as bandwidth.

In this example, the communication system 1300 includes electronic devices (ED) 1310*a*-1310*c*, radio access networks (RANs) 1320*a*-1320*b*, a core network 1330, a public switched telephone network (PSTN) 1340, the internet 1350, and other networks 1360. Although certain numbers of these components or elements are shown in FIG. 23, any reasonable number of these components or elements may be included.

The EDs 1310*a*-1310*c* and base stations 1370*a*-1370*b* are examples of communication equipment that can be configured to implement some or all of the functionality and/or embodiments described herein. For example, any one of the EDs 1310*a*-1310*c* and base stations 1370*a*-1370*b* could be configured to implement the encoding or decoding functionality (or both) described above. In another example, any one of the EDs 1310*a*-1310*c* and base stations 1370*a*-1370*b* could include the apparatus 1100, the apparatus 1200 or both described above in relation to FIGS. 11 and 12.

The EDs 1310*a*-1310*c* are configured to operate, communicate, or both, in the communication system 1300. For example, the EDs 1310*a*-1310*c* are configured to transmit, receive, or both via wireless or wired communication channels. Each ED 1310*a*-1310*c* represents any suitable end user device for wireless operation and may include such devices (or may be referred to) as a user equipment/device (UE), wireless transmit/receive unit (WTRU), mobile station, fixed or mobile subscriber unit, cellular telephone, station (STA), machine type communication (MTC) device, personal digital assistant (PDA), smartphone, laptop, computer, tablet, wireless sensor, or consumer electronics device.

In FIG. 23, the RANs 1320*a*-1320*b* include base stations 1370*a*-1370*b*, respectively. Each base station 1370*a*-1370*b* is configured to wirelessly interface with one or more of the EDs 1310*a*-1310*c* to enable access to any other base station 1370*a*-1370*b*, the core network 1330, the PSTN 1340, the Internet 1350, and/or the other networks 1360. For example, the base stations 1370*a*-1370*b* may include (or be) one or more of several well-known devices, such as a base transceiver station (BTS), a Node-B (NodeB), an evolved NodeB (eNodeB), a Home eNodeB, a gNodeB, a transmission point (TP), a site controller, an access point (AP), or a wireless router. Any ED 1310*a*-1310*c* may be alternatively or additionally configured to interface, access, or communicate with any other base station 1370*a*-1370*b*, the internet 1350, the core network 1330, the PSTN 1340, the other networks 1360, or any combination of the preceding. The communication system 1300 may include RANs, such as RAN 1320*b*, wherein the corresponding base station 1370*b* accesses the core network 1330 via the internet 1350, as shown.

The EDs 1310*a*-1310*c* and base stations 1370*a*-1370*b* are examples of communication equipment that can be configured to implement some or all of the functionality and/or embodiments described herein. In the embodiment shown in FIG. 23, the base station 1370*a* forms part of the RAN 1320*a*, which may include other base stations, base station controller(s) (BSC), radio network controller(s) (RNC), relay nodes, elements, and/or devices. Any base station 1370*a*, 1370*b* may be a single element, as shown, or multiple elements, distributed in the corresponding RAN, or otherwise. Also, the base station 1370*b* forms part of the RAN 1320*b*, which may include other base stations, elements, and/or devices. Each base station 1370*a*-1370*b* transmits and/or receives wireless signals within a particular geographic region or area, sometimes referred to as a "cell" Or "coverage area". A cell may be further divided into cell sectors, and a base station 1370*a*-1370*b* may, for example, employ multiple transceivers to provide service to multiple sectors. In some embodiments, there may be established pico or femto cells where the radio access technology supports such. In some embodiments, multiple transceivers could be used for each cell, for example using multiple-input multiple-output (MIMO) technology. The number of RAN 1320*a*-1320*b* shown is exemplary only. Any number of RAN may be contemplated when devising the communication system 1300.

The base stations 1370*a*-1370*b* communicate with one or more of the EDs 1310*a*-1310*c* over one or more air interfaces 1390 using wireless communication links e.g. radio frequency (RF), microwave, infrared (IR), etc. The air interfaces 1390 may utilize any suitable radio access technology. For example, the communication system 1300 may implement one or more channel access methods, such as code division multiple access (CDMA), time division multiple access (TDMA), frequency division multiple access (FDMA), orthogonal FDMA (OFDMA), or single-carrier FDMA (SC-FDMA) in the air interfaces 1390.

A base station 1370*a*-1370*b* may implement Universal Mobile Telecommunication System (UMTS) Terrestrial Radio Access (UTRA) to establish an air interface 1390 using wideband CDMA (WCDMA). In doing so, the base station 1370*a*-1370*b* may implement protocols such as HSPA, HSPA+ optionally including HSDPA, HSUPA or both. Alternatively, a base station 1370*a*-1370*b* may establish an air interface 1390 with Evolved UTMS Terrestrial Radio Access (E-UTRA) using LTE, LTE-A, and/or LTE-B. It is contemplated that the communication system 1300 may use multiple channel access functionality, including such schemes as described above. Other radio technologies for implementing air interfaces include IEEE 802.11, 802.15, 802.16, CDMA2000, CDMA2000 1x, CDMA2000 EV-DO, IS-2000, IS-95, IS-856, GSM, EDGE, and GERAN. Of course, other multiple access schemes and wireless protocols may be utilized.

The RANs 1320*a*-1320*b* are in communication with the core network 1330 to provide the EDs 1310*a*-1310*c* with various services such as voice, data, and other services. The RANs 1320*a*-1320*b* and/or the core network 1330 may be in direct or indirect communication with one or more other RANs (not shown), which may or may not be directly served by core network 1330, and may or may not employ the same radio access technology as RAN 1320*a*, RAN 1320*b* or both. The core network 1330 may also serve as a gateway access between (i) the RANs 1320*a*-1320*b* or EDs 1310*a*-1310*c* or both, and (ii) other networks (such as the PSTN 1340, the internet 1350, and the other networks 1360). In addition, some or all of the EDs 1310*a*-1310*c* may include functionality for communicating with different wireless networks over different wireless links using different wireless technologies and/or protocols. Instead of wireless communication (or in addition thereto), the EDs 1310*a*-1310*c* may communicate via wired communication channels to a service provider or switch (not shown), and to the internet 1350. PSTN 1340 may include circuit switched telephone networks for providing plain old telephone service (POTS). Internet 1350 may include a network of computers and subnets (intranets) or both, and incorporate protocols, such as IP, TCP, and UDP. EDs 1310*a*-1310*c* may be multimode devices capable of operation according to multiple radio access technologies, and incorporate multiple transceivers necessary to support such.

Figure 24A:
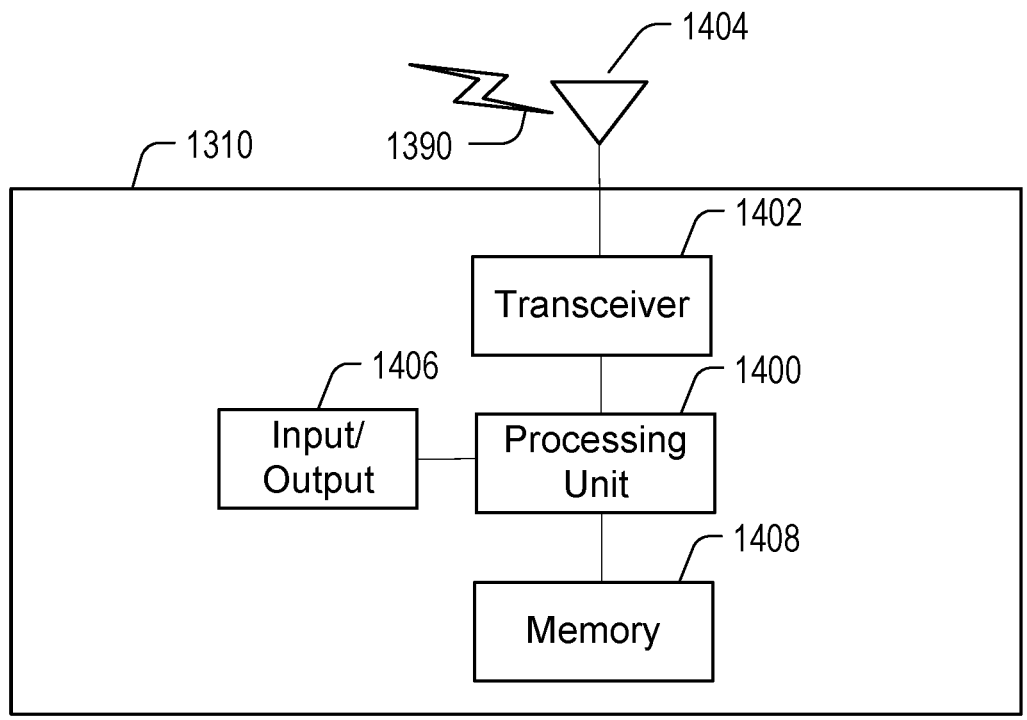
FIGS. 24A-B are block diagrams of an example Electronic Device (ED) and an example base station which may implement embodiments disclosed herein.
Figure 24B:
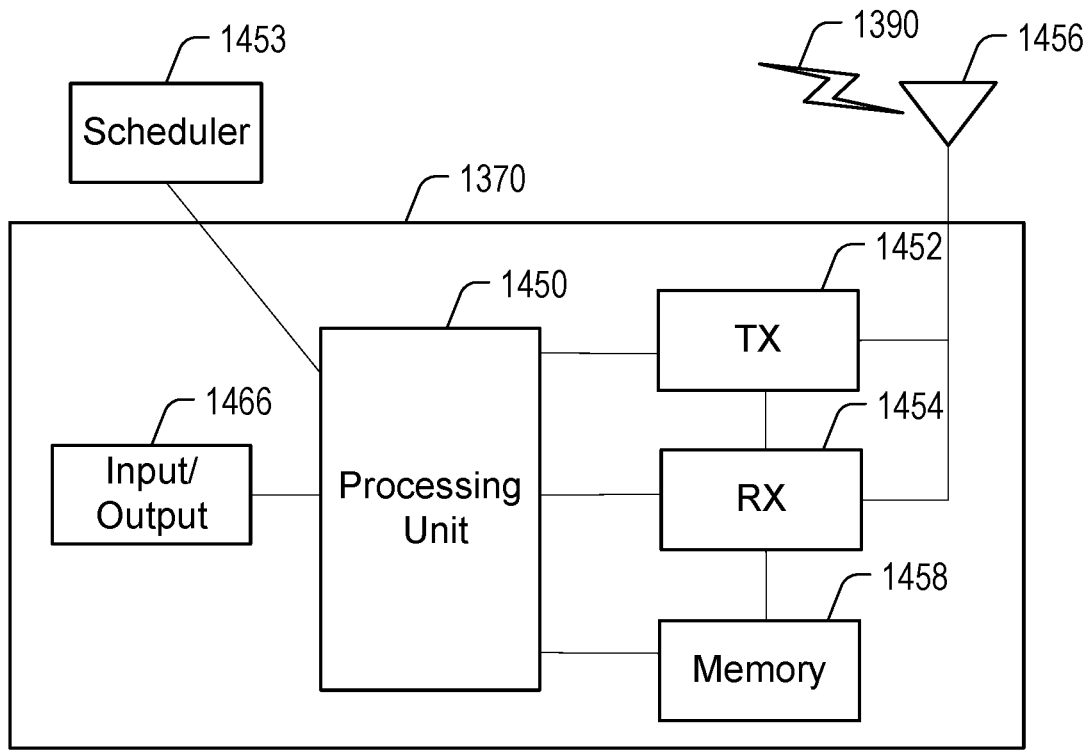

FIGS. 28A and 28B illustrate example devices that may implement the methods and teachings according to this disclosure. In particular, FIG. 24A illustrates an example ED 1310, and FIG. 24B illustrates an example base station 1370. These components could be used in the communication system 1300 or in any other suitable system.

As shown in FIG. 24A, the ED 1310 includes at least one processing unit 1400. The processing unit 1400 implements various processing operations of the ED 1310. For example, the processing unit 1400 could perform signal coding, data processing, power control, input/output processing, or any other functionality enabling the ED 1310 to operate in the communication system 1300. The processing unit 1400 may also be configured to implement some or all of the functionality and/dr embodiments described in more detail above. Each processing unit 1400 includes any suitable processing or computing device configured to perform one or more operations. Each processing unit 1400 could, for example, include a microprocessor, microcontroller, digital signal processor, field programmable gate array, or application specific integrated circuit.

The ED 1310 also includes at least one transceiver 1402. The transceiver 1402 is configured to modulate data or other content for transmission by at least one antenna or Network Interface Controller (NIC) 1404. The transceiver 1402 is also configured to demodulate data or other content received by the at least one antenna 1404. Each transceiver 1402 includes any suitable structure for generating signals for wireless or wired transmission and/or processing signals received wirelessly or by wire. Each antenna 1404 includes any suitable structure for transmitting and/or receiving wireless or wired signals. One or multiple transceivers 1402 could be used in the ED 1310, and one or multiple antennas 1404 could be used in the ED 1310. Although shown as a single functional unit, a transceiver 1402 could also be implemented using at least one transmitter and at least one separate receiver.

The ED 1310 further includes one or more input/output devices 1406 or interfaces (such as a wired interface to the internet 1350). The input/output devices 1406 permit interaction with a user or other devices in the network. Each input/output device 1406 includes any suitable structure for providing information to or receiving information from a user, such as a speaker, microphone, keypad, keyboard, display, or touch screen, including network interface communications.

In addition, the ED 1310 includes at least one memory 1408. The memory 1408 stores instructions and data used, generated, or collected by the ED 1310. For example, the memory 1408 could store software instructions or modules configured to implement some or all of the functionality and/or embodiments described above and that are executed by the processing unit(s) 1400. Each memory 1408 includes any suitable volatile and/or non-volatile storage and retrieval device(s). Any suitable type of memory may be used, such as random access memory (RAM), read only memory (ROM), hard disk, optical disc, subscriber identity module (SIM) card, memory stick, secure digital (SD) memory card, and the like.

As shown in FIG. 24B, the base station 1370 includes at least one processing unit 1450, at least one transmitter 1452, at least one receiver 1454, one or more antennas 1456, at least one memory 1458, and one or more input/output devices or interfaces 1466. A transceiver, not shown, may be used instead of the transmitter 1452 and receiver 1454. A scheduler 1453 may be coupled to the processing unit 1450. The scheduler 1453 may be included within or operated separately from the base station 1370. The processing unit 1450 implements various processing operations of the base station 1370, such as signal coding, data processing, power control, input/output processing, or any other functionality. The processing unit 1450 can also be configured to implement some or all of the functionality and/or embodiments described in more detail above. Each processing unit 1450 includes any suitable processing or computing device configured to perform one or more operations. Each processing unit 1450 could, for example, include a microprocessor, microcontroller, digital signal processor, field programmable gate array, or application specific integrated circuit.

Each transmitter 1452 includes any suitable structure for generating signals for wireless or wired transmission to one or more EDs or other devices. Each receiver 1454 includes any suitable structure for processing signals received wirelessly or by wire from one or more EDs or other devices. Although shown as separate components, at least one transmitter 1452 and at least one receiver 1454 could be combined into a transceiver. Each antenna 1456 includes any suitable structure for transmitting and/or receiving wireless or wired signals. Although a common antenna 1456 is shown here as being coupled to both the transmitter 1452 and the receiver 1454, one or more antennas 1456 could be coupled to the transmitter(s) 1452, and one or more separate antennas 1456 could be coupled to the receiver(s) 1454. Each memory 1458 includes any suitable volatile and/or non-volatile storage and retrieval device(s) such as those described above in connection to the ED 1310. The memory 1458 stores instructions and data used, generated, or collected by the base station 1370. For example, the memory 1458 could store software instructions or modules configured to implement some or all of the functionality and/or embodiments described above and that are executed by the processing unit(s) 1450.

Each input/output device 1466 permits interaction with a user or other devices in the network. Each input/output device 1466 includes any suitable structure for providing information to or receiving/providing information from a user, including network interface communications.

Various embodiments disclosed herein relate to specifying sub-channel sequences using shorter ordered sequences of numbers. This could reduce memory space requirements for ordered sequence storage.

The previous description of some embodiments is provided to enable any person skilled in the art to make or use an apparatus, method, or processor readable medium according to the present disclosure.

Various modifications to the embodiments described herein may be readily apparent to those skilled in the art, and the generic principles of the methods and devices described herein may be applied to other embodiments. Thus, the present disclosure is not intended to be limited to the embodiments shown herein but is to be accorded the widest scope consistent with the principles and novel features disclosed herein.

For example, although embodiments are described primarily with reference to bits, other embodiments may involve non-binary and/or multi-bit symbols. If one sub-channel can transmit more than one bit, then several bits can be combined into a symbol in a defined alphabet, and a non-binary symbol is encoded for each sub-channel. Accordingly, polarization kernels are not limited to binary kernels. Symbol-level (Galois field) or non-binary kernels are also contemplated. A non-binary kernel could be preferred for its higher degree of polarization than a binary kernel. However, decoding computation complexity is higher for a non-binary kernel, because a decoder would handle symbols rather than bits.

Non-binary kernels possess characteristics of binary kernels. Furthermore, non-binary kernels could be combined or cascaded with binary kernels to form one polar code. Although the Arikan 2-by-2 binary kernel is used herein as an example, disclosed features may be extended to other types of polarization kernels.

The present disclosure refers primarily to a 2-by-2 kernel as example to demonstrate and explain illustrative embodiments. However, it is understood that the techniques for selecting sub-channels as disclosed herein could be applied to other types of polarization kernels as well, such as non-two prime number dimension kernels, non-primary dimension kernels, and/or higher dimension kernels formed by a combination of different (primary or non-primary) dimensions of kernels.

As noted above, polar codes have been selected for uplink and downlink eMBB control channel coding for the new 5G air interface, also known as 5G new radio (NR). The techniques disclosed herein could be used not only for control data over a control channel but also or instead other types of data (e.g. user data) over any type of channel (e.g. a data channel).

Illustrative examples described herein refer to sub-channel sequences that are in increasing order of a reliability metric. In other embodiments, ordered sequences that are in decreasing reliability order could be used. Similarly, sequences could be generated in increasing order of reliability rather than starting with more reliable channels and building a sequence by adding sub-channels with progressively decreasing reliabilities.

The invention claimed is:

1. A method comprising:
obtaining an input bit sequence containing $N_1+N_2$ bits, the input bit sequence including information bits and frozen bits, where $N_1$ and $N_2$ are different powers of a polar code kernel size;
polar encoding $N_1$ bits of the input bit sequence with a first constituent polar encoder to produce a first set of $N_1$ polar encoded bits;
polar encoding $N_2$ bits of the input bit sequence with a second constituent polar encoder to produce a second set of $N_2$ polar encoded bits;
after the encoding the $N_1$ bits and the encoding the $N_2$ bits, combining at least some of the first set of $N_1$ polar encoded bits with at least some of the second set of $N_2$ polar encoded bits with a first additional polarizing stage to produce a set of $N_1$ combined bits; and
generating an asymmetric polar encoded codeword of length $N_1+N_2$ consisting of the set of $N_1$ combined bits and the second set of $N_2$ polar encoded bits.

2. The method of claim 1, wherein the polar encoding the $N_1$ bits, the polar encoding the $N_2$ bits, the combining the $N_1$ polar encoded bits with $N_1$ of the $N_2$ polar encoded bits, and the generating the asymmetric polar encoded codeword comprise multiplying the input bit sequence by a generator matrix.

3. The method of claim 1 further comprising:
transmitting the asymmetric polar encoded codeword over a wireless channel.

4. The method of claim 1 further comprising:
transmitting the $N_2$ polar encoded bits;
receiving feedback from which it can be concluded that the $N_2$ polar encoded bits were not decoded successfully; and
in response to receiving the feedback, transmitting the set of $N_1$ combined bits.

5. The method of claim 1 wherein $N_1<N_2$, and the first additional polarization stage is the same as a last set of connections and XOR operations of a polar code encoder of a size $K^{N_1+1}$, where K is a size of a polar code kernel, such that the set of $N_1$ combined bits is based on the $N_1$ polar encoded bits and $N_1$ of the $N_2$ polar encoded bits.

6. The method of claim 1 wherein $N_1>N_2$, and the first additional polarization stage includes part of a last set of connections and XOR operations of a polar code encoder of a size $K^{N_1+1}$, where K is a size of a polar code kernel, such that the set of $N_1$ combined bits includes $N_2$ of the $N_1$ polar encoded bits combined with the $N_2$ polar encoded bits and includes remaining $N_1-N_2$ of the $N_2$ polar encoded bits.

7. The method of claim 1 comprising:
encoding $N_A$ input bits with a length asymmetric $N_A$ polar code encoder by:
for each of a plurality of p subsets of the input bits having lengths $N_0, N_1, \ldots, N_{p-1}$, which sum to $N_A$, where $p>=3$, polar code encoding the subset with a respective constituent polar code encoder; and
linking together the outputs of the constituent polar code encoders recursively with additional polarizing stages such that each constituent polar code $N_i$ is linked with the next constituent code $N_{i+1}$ in sequence for i=0, 1, . . . , p−2, wherein the additional polarizing stage used for linking in each iteration is the same XOR transform which is used for last stage of an Arikan polar code of length $2N_{i+1}$,
wherein the subsets consist of a first subset containing the $N_1$ bits, and a subset containing the $N_2$ bits and p−2 further subsets,
wherein the constituent polar code encoders consist of the first constituent polar code encoder, the second constituent polar code encoder and p−2 further constituent polar code encoders, and
wherein the additional polarization stages are inclusive of the first additional polarization stage and p−2 further additional polarization stages.

8. The method of claim 1 further comprising:
adapting a value $N_A$, where $N_A=N_1+N_2$ based on feedback.

9. The method of claim 1, wherein $N_1$ is less than $N_2$, the combining comprises:

inputting the first set of $N_1$ polar encoded bits and $N_1$ of the second set of $N_2$ polar encoded bits to the first additional polarizing stage to produce the set of $N_1$ combined bits.

10. A method comprising:

encoding an input vector with an original polar code encoder to produce an initial codeword, wherein the original polar code encoder is an asymmetric polar code encoder for an asymmetric polar encoded codeword;

transmitting the initial codeword to a receiving device;

receiving, from the receiving device, feedback from which it can be concluded that the initial codeword was not decoded successfully;

after the receiving the feedback, generating an extended input vector by extending the input vector to include an extension vector that comprises at least one redundancy bit;

after the generating, encoding the extended input vector with an additional asymmetric polar code encoder based on a combination of the original polar code encoder, a further polar code encoder having a size equal to the size of the extension vector, and a further polarizing stage that links outputs of the original polar code encoder and the further polar code encoder; and transmitting an output of the further polarizing stage.

11. An apparatus comprising:

an input interface that obtains an input bit sequence containing $N_1+N_2$ bits including information bits and frozen bits, where $N_1$ and $N_2$ are different powers of a polar code kernel size;

a first polar code encoder that polar encodes $N_1$ bits of the input bit sequence with a first constituent polar encoder to produce a first set of $N_1$ polar encoded bits;

a second polar code encoder that polar encodes $N_2$ bits of the input bit sequence with a second constituent polar encoder, to produce a second set of $N_2$ polar encoded bits;

a first additional polarizing stage that combines at least some of the first set of $N_1$ polar encoded bits with at least some of the second set of $N_2$ polar encoded bits to produce a set of N1 combined bits after the first set of $N_1$ polar encoded bits and the second set of $N_2$ polar encoded bits are produced;

a codeword generator that generates an asymmetric polar encoded codeword of length $N_1+N_2$ consisting of the set of $N_1$ combined bits and the $N_2$ polar encoded bits; and a transmitter that transmits the asymmetric polar encoded codeword over a wireless channel.

12. The apparatus of claim 11 wherein the transmitter transmits the asymmetric polar encoded codeword by:

transmitting the $N_2$ polar encoded bits;

receiving feedback from which it can be concluded that the $N_2$ polar encoded bits were not decoded successfully; and in response to receiving the feedback, transmitting the set of $N_1$ combined bits.

13. The apparatus of claim 11 wherein $N_1<N_2$, and the first additional polarization stage is the same as a last set of connections and XOR operations of a polar code encoder of a size $K^{N_1+1}$, where K is a size of a polar code kernel, such that the set of $N_1$ combined bits is based on the $N_1$ polar encoded bits and $N_1$ of the $N_2$ polar encoded bits.

14. The apparatus of claim 10 wherein $N_1>N_2$, and the first additional polarization stage includes part of a last set of connections and XOR operations of a polar code encoder of a size $K^{N_1+1}$, where K is a size of a polar code kernel, such that the set of $N_1$ combined bits includes $N_2$ of the $N_1$ polar encoded bits combined with the $N_2$ polar encoded bits and includes remaining $N_1-N_2$ of the $N_2$ polar encoded bits.

15. An apparatus comprising:

an original polar code encoder that encodes an input vector to produce an initial codeword, wherein the original polar code encoder is an asymmetric polar code encoder for an asymmetric polar encoded codeword;

a transmitter that transmits the initial codeword to a receiving device;

a receiver that receives feedback from the receiving device from which it can be concluded that the initial codeword was not decoded successfully;

an extended input vector generator that generates an extended input vector by extending the input vector to include an extension vector that comprises at least one redundancy bit after the feedback is received; and an additional asymmetric polar code encoder that encodes the extended input vector after the extended input vector is generated, wherein the additional asymmetric polar code encoder is based on a combination of the original polar code encoder, a further polar code encoder having a size equal to the size of the extension vector, and a further polarizing stage that links outputs of the original polar code encoder and the further polar code encoder, wherein the transmitter further transmits an output of the further polarizing stage.

16. An apparatus comprising:

at least one processor operatively coupled to a memory and a transceiver, the at least one processor configured to:

obtain an input bit sequence containing $N_1+N_2$ bits, the input bit sequence including information bits and frozen bits, where $N_1$ and $N_2$ are different powers of a polar code kernel size;

polar encode $N_1$ bits of the input bit sequence with a first constituent polar encoder to produce a first set of $N_1$ polar encoded bits;

polar encode $N_2$ bits of the input bit sequence with a second constituent polar encoder to produce a second set of $N_2$ polar encoded bits;

after the first set of $N_1$ polar encoded bits and the second set of $N_2$ polar encoded bits are produced, combine at least some of the $N_1$ polar encoded bits with at least some of the $N_2$ polar encoded bits with a first additional polarizing stage to produce a set of $N_1$ combined bits; and generate an asymmetric polar encoded codeword of length $N_1+N_2$ consisting of the set of $N_1$ combined bits and the $N_2$ polar encoded bits.

17. The apparatus of claim 16 wherein the processor is further configured to:

transmit the $N_2$ polar encoded bits;

receive feedback from which it can be concluded that the $N_2$ polar encoded bits were not decoded successfully; and in response to receiving the feedback, transmit the set of $N_1$ combined bits.

18. The apparatus of claim 16 wherein $N_1<N_2$, and the first additional polarization stage is the same as a last set of connections and XOR operations of a polar code encoder of a size $K^{N_1+1}$, where K is a size of a polar code kernel, such that the set of $N_1$ combined bits is based on the $N_1$ polar encoded bits and $N_1$ of the $N_2$ polar encoded bits.

19. The apparatus of claim 16 wherein $N_1 > N_2$, and the first additional polarization stage includes part of a last set of connections and XOR operations of a polar code encoder of a size $K^{N_1+1}$, where K is a size of a polar code kernel, such that the set of $N_1$ combined bits includes $N_2$ of the $N_1$ polar encoded bits combined with the $N_2$ polar encoded bits and includes remaining $N_1-N_2$ of the $N_2$ polar encoded bits.

20. A non-transitory computer-readable medium having instructions stored thereon that, when executed by an apparatus, cause the apparatus to perform operations, the operations comprising:

obtaining an input bit sequence containing $N_1+N_2$ bits, the input bit sequence including information bits and frozen bits, where $N_1$ and $N_2$ are different powers of a polar code kernel size;

polar encoding $N_1$ bits of the input bit sequence with a first constituent polar encoder to produce a first set of $N_1$ polar encoded bits;

polar encoding $N_2$ bits of the input bit sequence with a second constituent polar encoder to produce a second set of $N_2$ polar encoded bits;

after the encoding the $N_1$ bits and the encoding the $N_2$ bits, combining at least some of the first set of $N_1$ polar encoded bits with at least some of the second set of $N_2$ polar encoded bits with a first additional polarizing stage to produce a set of $N_1$ combined bits; and generating an asymmetric polar encoded codeword of length $N_1+N_2$ consisting of the set of $N_1$ combined bits and the second set of $N_2$ polar encoded bits.

\* \* \* \* \*